United States Patent
Kim et al.

(10) Patent No.: US 7,999,307 B2
(45) Date of Patent: *Aug. 16, 2011

(54) NONVOLATILE MEMORY DEVICE HAVING CELL AND PERIPHERAL REGIONS AND METHOD OF MAKING THE SAME

(75) Inventors: Ju-Hyung Kim, Yongin-si (KR); Jung-Dal Choi, Suwon-si (KR); Jang-Hyun You, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 12/923,998

(22) Filed: Oct. 20, 2010

(65) Prior Publication Data

US 2011/0037118 A1 Feb. 17, 2011

Related U.S. Application Data

(63) Continuation of application No. 12/078,143, filed on Mar. 27, 2008, now Pat. No. 7,842,997.

(30) Foreign Application Priority Data

Mar. 28, 2007 (KR) ........................ 10-2007-0030468

(51) Int. Cl.
*H01L 27/115* (2006.01)
*H01L 21/8247* (2006.01)

(52) U.S. Cl. ............ 257/324; 257/326; 257/E27.103; 257/E29.309; 257/E21.679; 438/266; 438/591

(58) Field of Classification Search .......... 257/314–326, 257/391, 392, 536, 759, E27.103, E21.679, 257/E21.422, E29.309; 438/211, 257, 261, 266, 287, 279, 627, 591

See application file for complete search history.

(56) References Cited

U.S. PATENT DOCUMENTS 6,706,593 B1 3/2004 Kodama
(Continued)

FOREIGN PATENT DOCUMENTS

JP 10-074914 3/1998
(Continued)

OTHER PUBLICATIONS

English Language Abstract of KR 1020020073959 dated Sep. 28, 2002.

*Primary Examiner* — Victor Mandala
*Assistant Examiner* — Whitney Moore
(74) *Attorney, Agent, or Firm* — Harness, Dickey & Pierce, P.L.C.

(57) ABSTRACT

A nonvolatile memory device and method of making the same are provided. Memory cells may be provided in a cell area wherein each memory cell has an insulative structure including a tunnel insulating layer, a floating trap layer and a blocking layer, and a conductive structure including an energy barrier layer, a barrier metal layer and a low resistance gate electrode. A material having a lower resistivity may be used as the gate electrode so as to avoid problems associated with increased resistance and to allow the gate electrode to be made relatively thin. The memory device may further include transistors in the peripheral area, which may have a gate dielectric layer, a lower gate electrode of poly-silicon and an upper gate electrode made of metal silicide, allowing an improved interface with the lower gate electrode without diffusion or reaction while providing a lower resistance.

16 Claims, 17 Drawing Sheets

U.S. PATENT DOCUMENTS

| | | |
|---|---|---|
| 6,858,906 B2 | 2/2005 | Lee et al. |
| 2004/0169238 A1 | 9/2004 | Lee et al. |
| 2005/0088889 A1 | 4/2005 | Lee et al. |
| 2006/0180851 A1 | 8/2006 | Lee et al. |
| 2007/0184606 A1 | 8/2007 | You et al. |
| 2009/0321815 A1 * | 12/2009 | Sung et al. .................... 257/324 |

FOREIGN PATENT DOCUMENTS

| | | |
|---|---|---|
| JP | 2006-278848 | 10/2006 |
| KR | 10-0414211 | 1/2004 |
| KR | 2006-0106292 | 10/2006 |
| KR | 2006-0111918 | 10/2006 |
| KR | 2007-0014932 | 2/2007 |

* cited by examiner

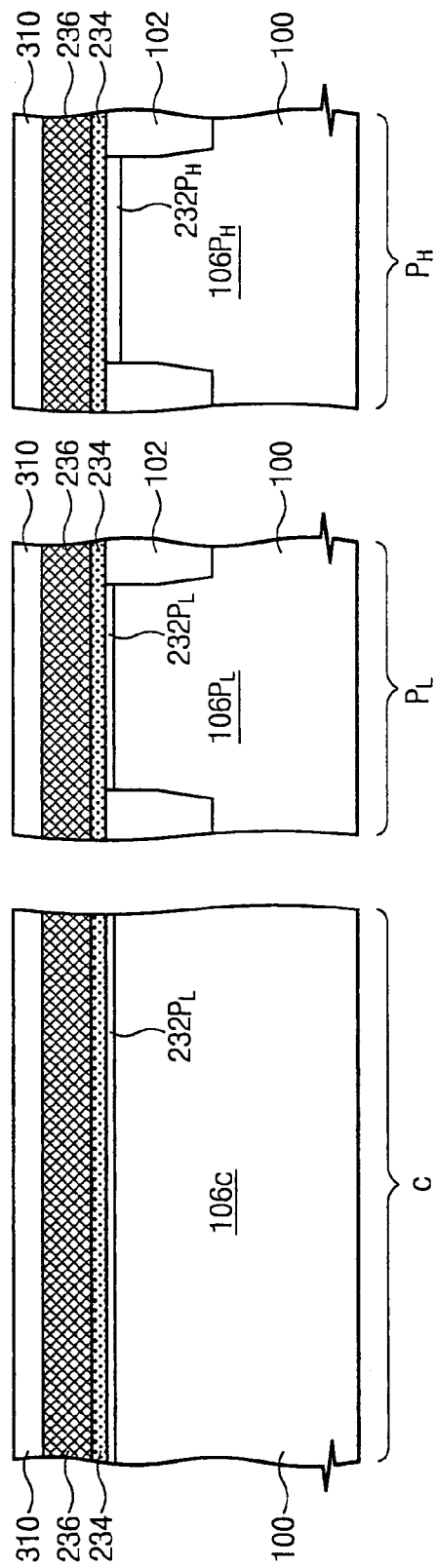

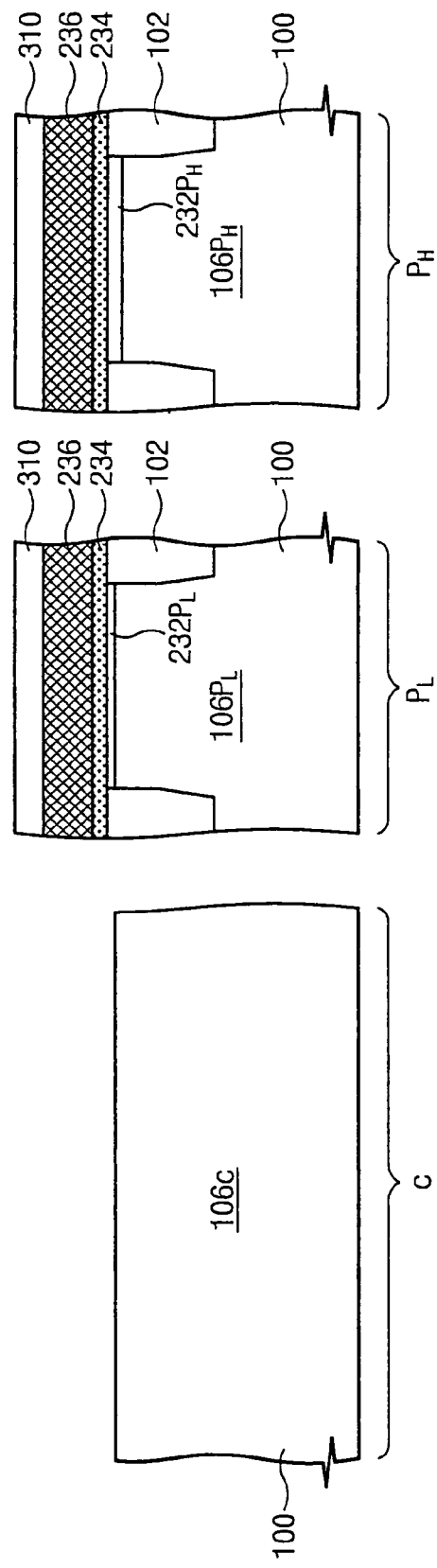

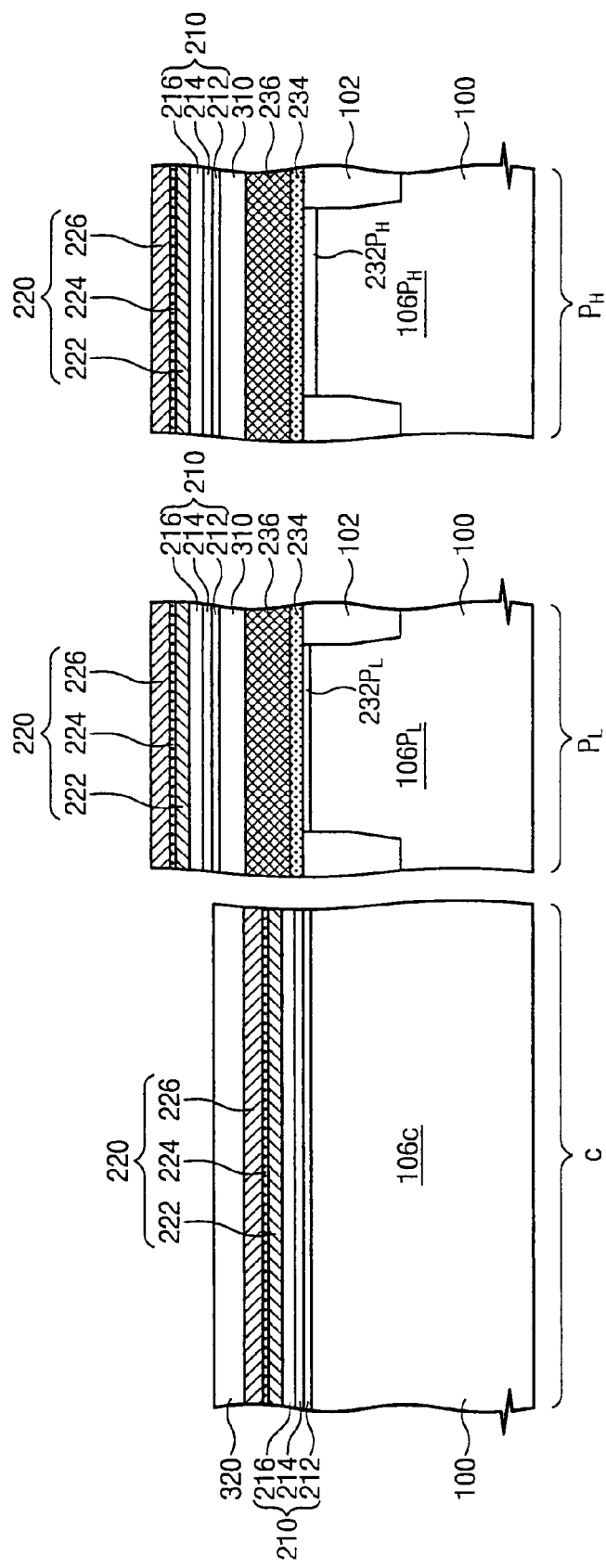

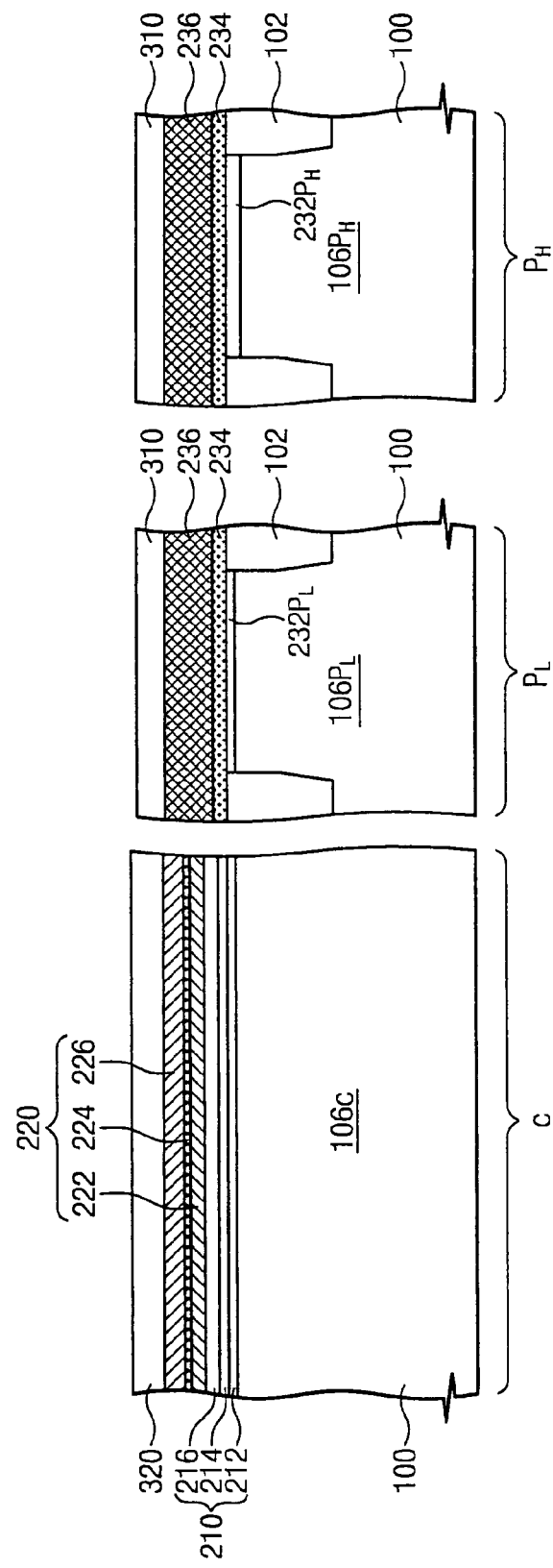

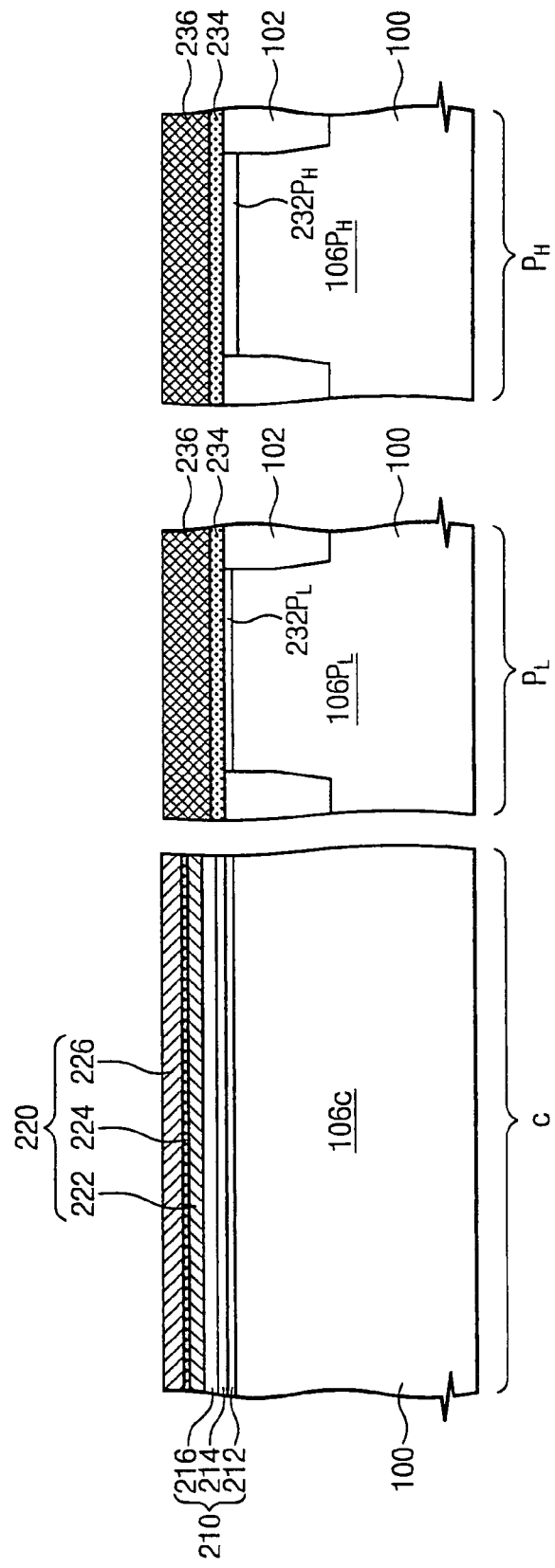

NONVOLATILE MEMORY DEVICE HAVING CELL AND PERIPHERAL REGIONS AND METHOD OF MAKING THE SAME

PRIORITY STATEMENT

This application is a Continuation of U.S. application Ser. No. 12/078,143 filed Mar. 27, 2008 now U.S. Pat. No. 7,842,997, which claims priority from Korean Patent Application No. 10-2007-0030468, filed on Mar. 28, 2007, in the Korean Intellectual Property Office (KIPO), the entire contents of each of which are herein incorporated by reference.

BACKGROUND

1. Field

Example embodiments relate to a nonvolatile semiconductor memory device and a method of making the same. Other example embodiments relate to a nonvolatile semiconductor memory device wherein characteristics of a memory cell and a peripheral cell may be optimized or improved and a method of making the same.

2. Description of the Related Art

Nonvolatile semiconductor memory devices may be capable of storing data even after an external power supply is removed. To achieve this function, nonvolatile devices may be supplied with a floating layer upon which charges may be stored or removed depending on a program or erase status of the device. Two types of such floating layer devices may include a floating gate type device and a floating trap type device.

A floating gate type device may include a conductive gate layer that floats due to its isolation by a surrounding insulating layer. The floating gate may be isolated from a substrate channel below and from a control gate above. The floating gate type device may be respectively programmed and erased by storing and removing charges as free carriers on the conductive floating gate. A floating trap type device may include a non-conductive layer that may be floating between a substrate channel and a control gate. The floating trap type device may be programmed and erased by storing and removing charges in traps in the non-conductive floating layer.

A known type of floating trap type device may be a silicon-oxide-nitride-oxide-semiconductor (SONOS) device. A SONOS device may include a tunneling insulating layer on a substrate, a charge storage layer on the tunneling layer, a blocking insulating layer on the charge storage layer and a gate electrode on the blocking layer. The substrate may include a P-type silicon substrate having N-type impurity layers formed on either side of the gate electrode as a source and drain. Thermal oxide may be used to form the tunneling layer and silicon nitride may be used as the charge storage layer. During operation, charges may be moved to and from the charge storage layer from and to the substrate in order to program and erase the memory cell.

To address certain shortcomings of SONOS technology, a floating trap type memory device including a metal (e.g. tantalum) layer, a high-k dielectric (e.g. aluminum oxide) layer, and a nitride-oxide-semiconductor layered structure (TANOS) has been introduced. In a TANOS device, a gate may be made of a metal, for example tantalum, and a blocking layer may be made of a high-k dielectric material, for example, aluminum oxide. The use of a high-k dielectric material as a blocking layer may be a significant feature of the TANOS architecture. Additional features of a TANOS device may include a high work function layer and a barrier metal layer as part of the gate electrode structure. TANOS technology may be disclosed in U.S. Pat. No. 6,858,906, and various additional TANOS related technologies have been proposed, for example in U.S. Patent Application Publications 2004/0169238 and 2006/0180851, the entire disclosures of all of which are hereby incorporated by reference. Efforts towards improving the performance and function of the TANOS technology and optimizing or improving the architecture of the TANOS device, including its gate structure, are continuing.

Along with the floating trap type memory cells, e.g., a TANOS cell, a nonvolatile memory device may also be formed having peripheral regions. The peripheral regions may include various devices, e.g., MOS transistors, which may be used for programming, erasing and otherwise controlling the memory cells. Typically, the MOS transistors of the peripheral region have gate electrodes formed of a silicon material, e.g., doped poly-silicon.

As the demand for capacity of such nonvolatile memories increases, a line width of patterns used to form the transistors may be decreasing. The reduction in line widths correlates to an increase in the resistance of the conductive patterns, e.g., the gate electrodes of the peripheral transistors, and causes a corresponding increase in the resistance-capacitance (RC) delay. For example, if a line width of a transistor's gate electrode may be decreased and its resistance increased, an RC delay associated with the transistor may be increased, thus causing an increased operating time of the transistor and its corresponding circuit.

One proposed method to address the increased resistance is to include a material having a decreased resistivity as part of the peripheral gate electrode, e.g., tungsten (W). Compared to doped poly-silicon which has a resistivity of about $10^{-5}$ $\Omega$-m, tungsten has a resistivity of about $5.5\times10^{-8}$ $\Omega$-m which may be several orders of magnitude less than that of doped poly-silicon. Therefore, the line widths of the peripheral devices may be decreased without an increase in RC delay. Moreover, a processing convenience is provided in that a relatively high conductivity metal, e.g., tungsten or tantalum, used in a TANOS cell may also be used in forming the peripheral cell.

However, in a peripheral MOS transistor, tungsten and other relatively low resistivity metals may react and diffuse with underlying layers, e.g., poly-silicon, and may cause deterioration of the transistor's reliability. To address this concern, a barrier metal layer may be placed between the tungsten layer and underlying poly-silicon layer. Generally, a metal nitride may be used as the barrier metal to prevent or retard reaction and diffusion of tungsten. Using the barrier metal layer may provide another processing convenience because a same barrier metal used in the TANOS process may be used in forming the peripheral transistors. However, the use of the metal nitride layer between the tungsten and poly-silicon layers may cause an increase in the interface resistance between the poly-silicon and the tungsten. Because the interface resistance may be increased, a program voltage pulse may not be sufficient for programming the memory cell and the RC delay may again be increased.

In a conventional TANOS memory circuit having a peripheral region, a relatively low resistivity metal layer used in the TANOS memory cell may also be used as an overlying layer in the peripheral transistor. For example, in the peripheral region, the relatively low resistivity layer may overlay a poly-silicon gate layer so as to lower the gate resistance. However, use of the relatively low resistivity metal layer may require that a barrier metal layer be used to avoid reaction and/or diffusion. Unfortunately, the use of the barrier metal layer may cause an increase in the interface resistance, thereby causing a voltage drop and potential failure to generate an appropriate level of program voltage pulse.

SUMMARY

Example embodiments may address at least the above-mentioned problems and/or disadvantages and to provide at least the advantages described below. Accordingly, example embodiments may provide a nonvolatile memory device and method for making a nonvolatile memory device in which characteristics of both a memory cell and a peripheral cell may be optimized or improved. Example embodiments provide a process for integrating an optimized or improved TANOS cell in a memory region with an optimized or improved transistor in a peripheral region by an optimized or improved gate forming process.

In accordance with example embodiments, a nonvolatile memory device may be provided. The memory device may include a semiconductor substrate having a cell region and a peripheral region. A cell gate may be in the cell region and the cell gate may include a tunnel insulating layer on the semiconductor substrate, a charge storage insulating layer on the tunnel insulating layer, a blocking insulating layer on the charge storage insulating layer and a low resistance layer, having a first resistivity, above the blocking layer. A peripheral gate may be in the peripheral region and the peripheral gate may include a gate insulating layer on the semiconductor substrate, a lower gate electrode on the gate insulating layer, and an upper gate electrode, having a second resistivity, on the lower gate electrode, wherein the second resistivity may be greater than the first resistivity.

In accordance with example embodiments, the low resistance layer may have a first thickness, and the upper gate electrode may have a second thickness, wherein the second thickness may be greater than the first thickness.

In accordance with example embodiments, a method of manufacturing a nonvolatile memory device may be provided. The method may include forming a semiconductor substrate having a cell region and a peripheral region, and forming a cell gate in the cell region and a peripheral gate in the peripheral region, wherein forming the cell gate may include forming a tunnel insulating layer on the semiconductor substrate, a charge storage insulating layer on the tunnel insulating layer, a blocking insulating layer on the charge storage insulating layer and a low resistance layer, having a first resistivity, above the blocking insulating layer, and forming the peripheral circuit gate may include forming a gate insulating layer on the semiconductor substrate, a lower gate electrode on the gate insulating layer, and an upper gate electrode, having a second resistivity, on the lower gate electrode, wherein the second resistivity may be greater than the first resistivity.

In accordance with example embodiments, the method may include forming the low resistance layer to have a first thickness, and the upper gate electrode to have a second thickness, wherein the second thickness may be greater than the first thickness.

BRIEF DESCRIPTION OF THE DRAWINGS

Example embodiments will be more clearly understood from the following detailed description taken in conjunction with the accompanying drawings. FIGS. 1-7B represent non-limiting, example embodiments as described herein.

FIG. 1 is a plan view illustrating a cell region and a peripheral region of a nonvolatile memory device according to example embodiments;

FIG. 2 is a cross-sectional view taken along lines IIc-IIc', $IIp_L$-$IIp_L$' and $IIp_H$-$IIp_H$' of FIG. 1 according to example embodiments;

FIGS. 3A-3I are cross-sectional views illustrating a method of forming a nonvolatile memory device according to example embodiments;

FIG. 4 is a cross-sectional view taken along lines IIc-IIc', $IIp_L$-$IIp_L$' and of FIG. 1 according to example embodiments.

FIG. 6 is a cross-sectional view taken along lines IIc-IIc', $IIp_L$-$IIp_L$' and $IIp_H$-$IIp_H$' of FIG. 1 according to example embodiments.

FIGS. 7A-7B are cross-sectional views illustrating a method of forming a nonvolatile memory device according to example embodiments.

Figure 1:
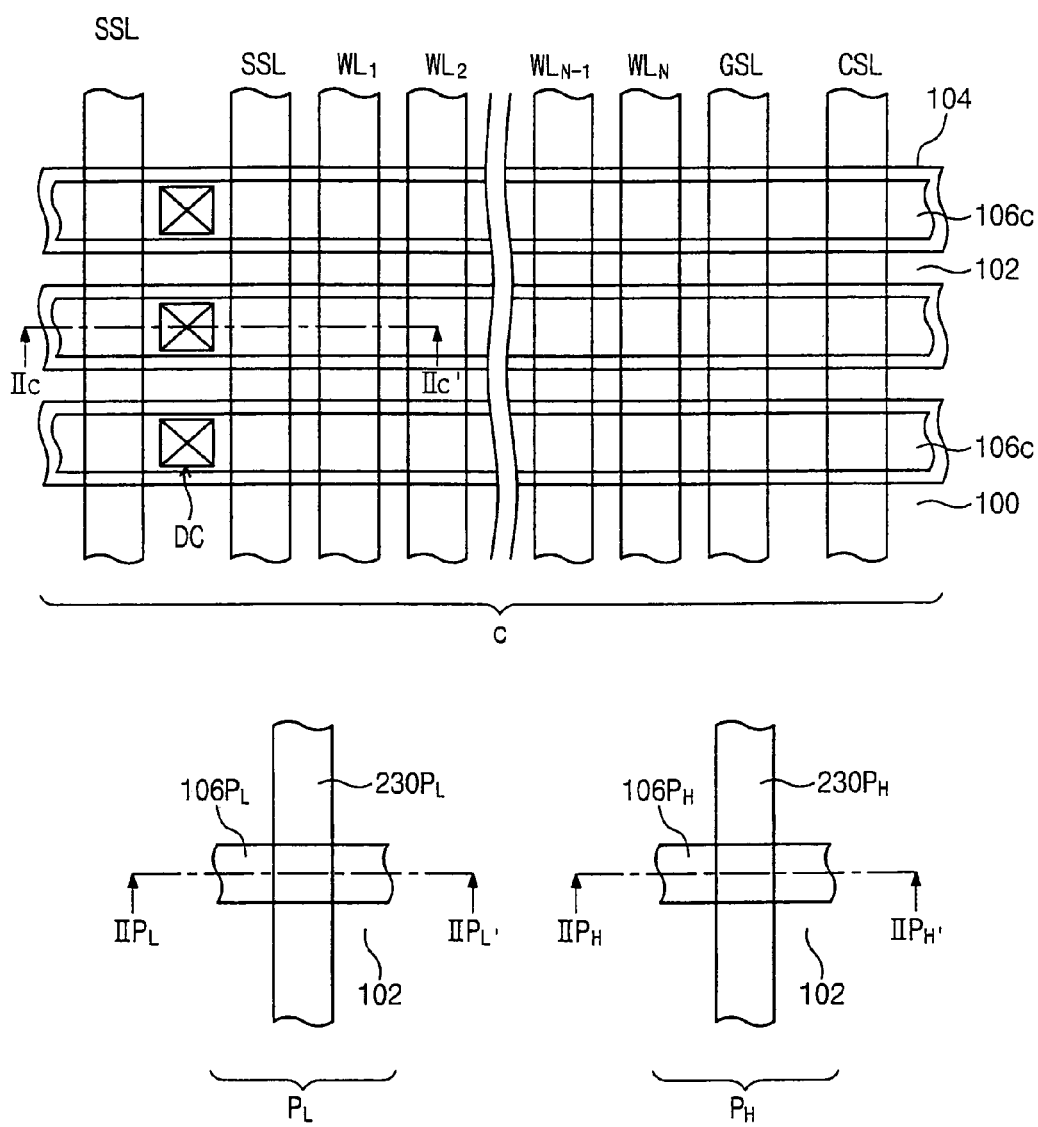

Throughout the drawings, it should be noted that like reference numbers are used to depict the same or similar elements, features and structures. It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

The following description with reference to the accompanying drawings may be provided to assist in a comprehensive understanding of example embodiments as defined by the claims and their equivalents. It includes various specific details to assist in that understanding but these are to be regarded as merely examples. Accordingly, those of ordinary skill in the art will recognize that various changes and modifications of the embodiments described herein can be made without departing from the scope and spirit of example embodiments. Also, descriptions of well-known functions and constructions are omitted for clarity and conciseness.

Hereinafter, example embodiments will be described in detail with reference to the attached drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a conventional overlying metal layer may be replaced by a metal silicide layer in peripheral region transistor such that the barrier metal layer may no longer be required. Because the metal silicide layer for structuring the gate in the peripheral region has a resistance greater than that of the metal layer, the metal silicide layer may be formed to have a thickness greater than that of the low resistivity metal layer. Accordingly, example embodiments concurrently provide a TANOS memory cell transistor and a peripheral cell transistor, wherein characteristics of both transistors may be optimized or improved.

FIG. 1 is a plan view illustrating a nonvolatile memory device according to example embodiments. As illustrated in FIG. 1, a device may be formed in a substrate 100. The substrate 100 may include a single crystal silicon layer, a poly-silicon layer, a silicon-on-insulator (SOI) substrate, and/or a silicon on silicon-germanium (SiGe) substrate. Formed in the substrate 100 may be a region "c" which may include a cell region and a region "p" which may include a peripheral region. Furthermore, the peripheral region "p" may include a high voltage region "$p_H$" and a low voltage region "$p_L$". The cell region and the peripheral region may include a plurality of active areas 106, e.g. 106c, $106p_H$ and $106p_L$. As illustrated in FIG. 1, the active areas 106c of the cell region may be formed to extend in a first direction and formed generally in parallel to one another. Similarly, low voltage active area $106p_L$ and high voltage active area $106p_H$ may be formed parallel to each other and may be formed parallel to other low and high voltage active areas and the cell active areas. The low and high voltage active areas may also be formed in different configurations as the circuit requirements or other layout constraints may dictate. The active areas 106c, $106p_L$, and $106p_H$ may have their boundaries defined by a device isolation layer 102. In example embodiments, the device isolation layer 102 may be a shallow trench isolation layer. However, a deep trench isolation layer or a field oxide layer may also be used.

The cell region "c" may include a Common Source Line (CSL) and bitline plugs DC separated from each other by a distance. The CSL may extend across the active areas 106c in a second direction, which may be generally orthogonal to the first direction. The CSL may be a conductive structure that contacts underlying active areas 106c. The bitline plugs DC, while being electrically discontinuous with each other, may be generally formed to extend in a line that may be parallel to the CSL in the second direction. A String Selection Line (SSL) and a Ground Selection Line (GSL) may be formed generally in parallel with each other and generally in parallel with the CSL and bitline plugs DC. The SSL and GSL may extend in the second direction over the active areas 106c between the CSL and bitline plugs DC. The SSL may be adjacent to the bitline plugs DC while the GSL may be adjacent the CSL. It should be understood that the terms CSL, SSL and GSL may be merely labels which do not imply specific functionality or arrangement to the respective structures.

A plurality of word lines WL, e.g. $WL_1$-$WL_N$, may be formed between and generally parallel to the SSL and GSL to extend in the second direction across the active areas 106c. The word lines may include a floating trap structure that may store charges and may be a part of the nonvolatile memory structure which may be used for programming the device. The cell region "c" may also include a bit line 104 which generally run in the first direction and, as illustrated in FIG. 1, may be formed so as to shadow the active areas 106c. The bit line 104 may make contact to underlying active areas through corresponding bit line plugs DC.

The peripheral region "p" may include the low voltage region "$p_L$" and the high voltage region "$p_H$". The low voltage region and the high voltage region may be formed to accommodate various devices, e.g., transistors, which may be used to program, erase and otherwise control the memory cell transistors of region "c". The low and high voltage regions $p_L$ and $p_H$ may include active areas $106p_L$ and $106p_H$, respectively. The active areas $106p_L$ and $106p_H$ may be defined by isolation layer 102. As illustrated, the low voltage region may include a gate electrode $230p_L$ and the high voltage region may similarly include a gate electrode $230p_H$.

Figure 2:
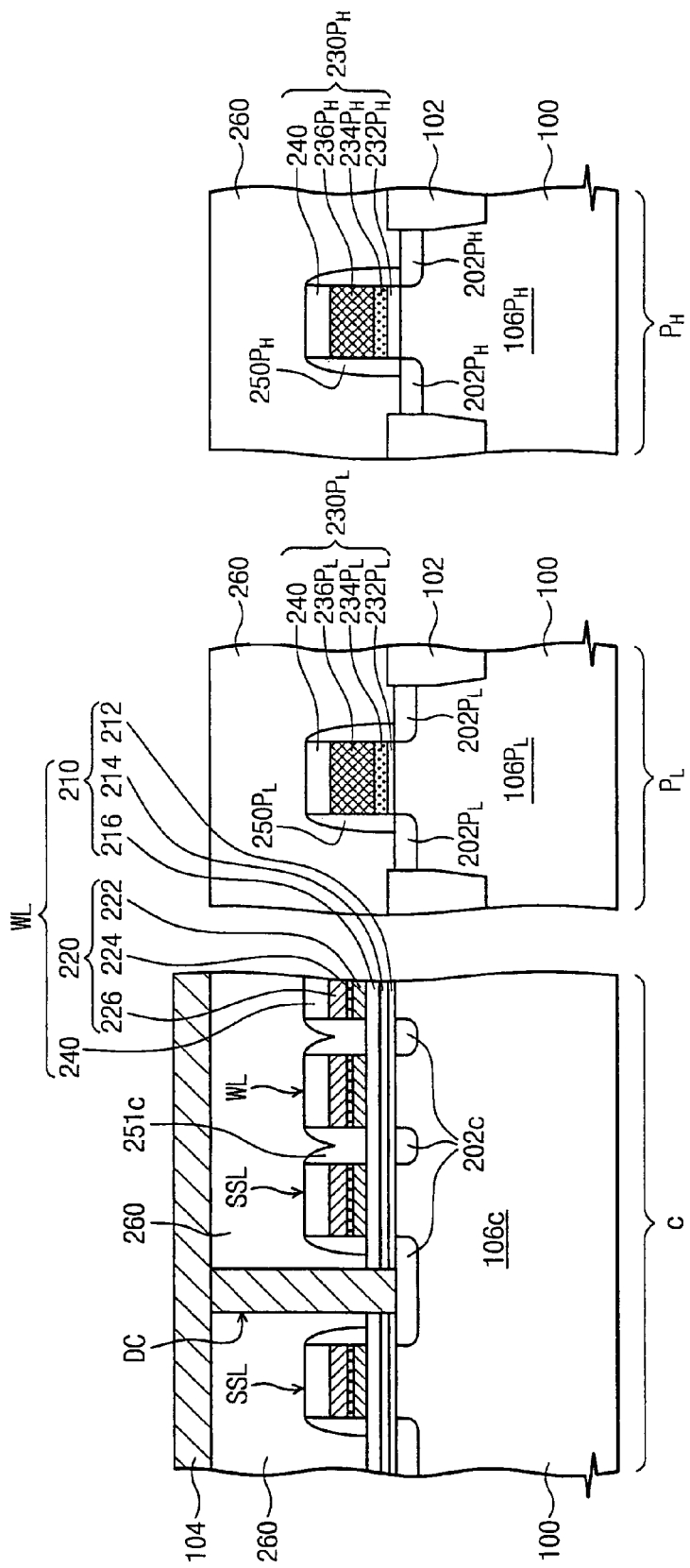

FIG. 2 illustrates a non-volatile memory device according to example embodiments. FIG. 2 is a cross-sectional view taken along lines IIc-IIc', $IIp_L$-$IIp_L$' and $IIp_H$-$IIp_H$' of FIG. 1. In cell region "c", each cell gate, corresponding to one of $WL_1$-$WL_N$, may include a layered insulating structure 210 as a floating trap structure and a layered conducting structure 220 as a control gate. The cell gates may further include a hard mask layer 240. In example embodiments as illustrated in FIG. 2, the layered insulating structure 210 may extend under and between each of the plurality of cell gates WL. The SSL gates, as well as the GSL gates which may not be shown in FIG. 2, may be similar in structure to the cell gates WL. For example, the SSL and GSL gates may include the layered insulating structure 210 as a dielectric layer as well as the layered conducting structure 220 as a gate electrode and the layered insulating structure 210 may extend under and between the SSL and GSL gates. As further illustrated in FIG. 2, the insulating structure 210 may extend from under the SSL gate to the bitline contact DC and may similarly extend from under the GSL to the CSL, though not shown in the figure.

Cell spacers 251c, which may include a single or multi-layered structure of, for example, silicon oxide, silicon nitride and/or a low dielectric material, may be formed on either side of the cell gates (WL) as well as the SSL and GSL gates. The cell spacers 251c may extend from an upper portion of the gates, for example, the top of the gates, to a location above the layered insulating structure 210. An interlayer dielectric 260 may be formed to generally cover the nonvolatile device. The interlayer dielectric may include a single or multi-layered structure, for example, a silicon oxide layer, a silicon nitride layer, a polymer layer, and/or a low dielectric layer. A bit line 104 may be formed overlying the interlayer dielectric 260 and may make contact to an underlying active area through bit line plug DC. As illustrated, the bitline plug DC may penetrate through the interlayer dielectric 260.

Impurity layers 202c may be formed in active areas 106c to form source/drain regions and contact regions. More specifically, impurity layers 202c may be formed on either side of the SSLs and WLs and under the bitline contact DC as illustrated and may be formed on either side of the GSL as well as under the CSL though not shown. In conjunction with associated gates of the WL, SSL and GSL, the impurity layers 202c may form transistors. Impurity layers 202c may also form contact regions in conjunction with an overlying bitline contact DC and the CSL. The impurity layers 202c may have different structures depending on their use with the WL, SSL, GSL, CSL, and bitline contact. For example, the impurity regions may have different doping concentration levels, different depths or widths and different impurity types depending on the needs of the associated transistor or contact region.

The layered insulating structure 210 may include a tunnel insulating layer 212, a charge storage insulating layer 214 and a blocking insulating layer 216. The tunnel insulating layer 212 may be formed above the substrate 100 and may include one or more layers of, for example, silicon oxide, silicon oxynitride (SiON), silicon nitride, a silicon oxide layer having a nitride portion, aluminum oxide ($Al_2O_3$), hafnium aluminate (HfAlO), hafnium aluminum oxynitride (HfAlON), hafnium silicate (HfSiO) and hafnium silicon oxynitride (HfSiON).

The charge storage insulating layer 214 may be formed above the tunnel insulating layer and may be used to trap or store charges for use in programming each cell gate WL. The charge storage insulating layer 214 may include one or more layers of, for example, poly-silicon, silicon nitride, silicon oxynitride, silicon rich oxide, ferroelectric materials, nano-crystalline silicon, nano-crystalline silicon germanium, nano-crystalline metal, aluminum oxide ($Al_2O_3$), hafnium oxide ($HfO_2$), hafnium aluminate (HfAlO), hafnium aluminum oxynitride (HfAlON), hafnium silicate (HfSiO) and/or hafnium silicon oxynitride (HfSiON). The charge storage insulating layer 214 may include a quantum-dot layer. For example, charge storage insulating layer 214 may include a layer of silicon, germanium, and/or metal quantum-dots.

The blocking insulating layer 216 may be formed above the charge storage insulating layer 214 and may have a dielectric constant greater than that of the tunnel insulating layer 212. The blocking insulating layer 216 may include a metallic oxide or a metallic oxynitride of a Group III element or a Group VB element. According to other example embodiments, the blocking insulating layer 216 may include a doped metal oxide or a doped metal oxynitride in which the metal oxide may be doped with a Group IV element. The Group IV element may reduce leakage current from the memory cell. The Group IV element may be doped in the metal oxide to about 0.1 to about 30 weight percent. The blocking insulating layer 216 may include one or more layers of, for example, silicon oxide, silicon oxynitride (SiON), silicon nitride, and metallic oxide, e.g., aluminum oxide ($Al_2O_3$), hafnium oxide ($HfO_2$), hafnium aluminate ($Hf_{1-x}Al_xO_y$), hafnium aluminum oxynitride (HfAlON), hafnium silicate ($Hf_xSi_{1-x}O2$), hafnium silicon oxynitride (HfSiON), lanthanum oxide ($La_2O_3$), zirconium oxide ($ZrO_2$), zirconium silicon oxide ($Zr_xSi_{1-x}O_2$), and/or zirconium silicon oxynitride (ZrSiON).

The material $Al_2O_3$ may have a dielectric constant of about 10 and an energy band gap of about 8.3 eV and the material $ZrO_2$ may have a dielectric constant of about 25 and an energy band gap of about 8.3 eV. The blocking insulating layer 216 may also comprise one or more layers of AlO, $Ta_2O_5$, $TiO_2$, PZT[(Pb(Zr,Ti)$O_3$)), $PbTiO_3$, $PbZrO_3$, PLZT[(Pb,La)(Zr,TiO_3)], PbO, $SrTiO_3$, $BaTiO_3$, $V_2O_5$, BST[Ba,Sr)$TiO_3$], SBT ($SrBi_2Ta_2O_9$), $Bi_4Ti_3O_{12}$, and combinations thereof.

In example embodiments, the blocking insulating layer 216 may include a layer similar to that of the charge storage insulating layer 214. For example, both the blocking insulating layer 216 and the charge storage insulating layer 214 may include a layer of hafnium aluminate (HfAlO), hafnium aluminum oxynitride (HfAlON), hafnium silicate (HfSiO) and/or hafnium silicon oxynitride (HfSiON). In such a case, a relative stoichiometric amount of hafnium in the charge storage insulating layer 214 may be higher than the relative stoichiometric amount of hafnium in the blocking insulating layer 216 so as to increase a trap density in the charge storage insulating layer 214 and to enhance an insulation characteristic of the blocking insulating layer 216.

In example embodiments, the blocking insulating layer 216 may have a dielectric constant higher than that of the tunnel insulating layer 212. For example, the blocking insulating layer 216 may include at least one layer of material having a dielectric constant that may be higher than any layer included in the tunnel insulating layer 212. In example embodiments, the blocking insulating layer 216 and the tunnel insulating layer 212 may be formed of materials having substantially similar dielectric constants, for example, they may be formed of the same material. In that case, the blocking insulating layer 216 may have a thickness that may be greater than a thickness of the tunnel insulating layer 212.

The layered conducting structure 220 may include an energy barrier layer 222, a barrier metal layer 224 and a low resistance layer 226. The energy barrier layer 222 may be formed above the blocking insulating layer 216 and may include a metal having a work function greater than about 4 eV. For example, the energy barrier layer 222 may include one or more layers of, for example, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide ($Ti_3Al$), titanium aluminum nitride ($Ti_2AlN$), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium (Ru), ruthenium dioxide ($RuO_2$) nickel silicide (NiSi), palladium (Pd), iridium (Ir), platinum (Pt), cobalt (Co), cobalt silicide (CoSi) and/or aluminum silicide (AlSi).

The barrier metal layer 224 may be formed above the energy barrier layer 222. The barrier metal layer 224 may be formed of a material that reduces or prevents an interfacial reaction and/or mutual diffusion between the blocking insulating layer 216 or energy barrier layer 222 and the low resistance layer 226. The barrier metal layer 224 may include one or more layers of, for example, tungsten nitride (WN), tungsten silicon nitride (WSiN) titanium nitride (TiN) or any other metal nitride that aides in preventing or reducing an interfacial reaction and/or mutual diffusion.

The low resistance layer 226 may be formed above the barrier metal layer 224. The low resistance layer may include one or more layers of, for example, tungsten (W), copper (Cu), aluminum (Al), gold (Au), silver (Ag), molybdenum (Mo), titanium (Ti), platinum (Pt), palladium (Pd) and other low resistance materials.

According to example embodiments, forming the cell region "c" provides optimization or improvement of certain characteristics of the cell gates WL. For example, the layered insulating structure 210 may be configured such that the blocking insulating layer 216 has a higher dielectric constant than that of the tunnel insulating layer 212. Accordingly, when a cell gate WL may be programmed, a higher electric field intensity may be provided for the tunnel insulating layer 212 as compared to the electric field intensity provided for the blocking insulating layer 216. Therefore, electrons may be more easily injected through the tunnel insulating layer 212 from the substrate 100 as compared to holes from the layered conducting structure 220, which will result in faster programming of the cell gate WL. Similarly, the relative dielectric constants will provide for faster erase times. Similar results may be obtained, and the characteristics optimized or improved, if the tunnel insulating layer 212 and the blocking insulating layer 216 may be formed of the same material or formed to have substantially the same dielectric constant but the blocking insulating layer may be made thicker than the tunnel insulating layer 212.

Furthermore, characteristics of the cell gate WL may be optimized or improved by the layered conducting structure 220. For example, the energy barrier layer 222 may be provided by using a material having a work function greater than about 4 eV which may be the work function of N-type poly-silicon. By using an energy barrier layer with a higher work function, it becomes more difficult for electrons to move from the low resistance layer 226 to the charge storage insulating layer 214. Accordingly, during an erase process of the cell gate WL, while holes in the substrate 100 may be tunneling through the tunnel insulating layer 212 into the charge storage insulating layer 214 as desired, an amount of electrons tunneling from the low resistance layer 226 to the charge storage insulating layer 214 may be lowered. Accordingly, an erase process may become faster.

The cell gate WL may also be optimized or improved by using a low resistance layer 226 formed of a material, e.g., tungsten. Because tungsten has a lower resistivity than, for example, poly-silicon, the resistance of the cell gate WL may be reduced and therefore RC delays may similarly be reduced. Generally, the low resistance layer 226 may be formed to have a first resistance which may be lower than a resistance of an upper gate electrode of the peripheral region and formed to have a first thickness which may be less than a thickness of the upper gate electrode layer 236. Furthermore, the low resistance layer 226 may be made to have a relatively thin profile which provides improved surface topology for overlying layers.

Referring again to FIG. 2, the peripheral region "p" may include a low voltage region $p_L$ and a high voltage region $p_H$, which may include a low voltage transistor and a high voltage transistor, respectively. The low voltage transistor, formed in low voltage region $p_L$, may include a low voltage peripheral gate electrode $230p_L$ and impurity layers $202p_L$. The high voltage transistor formed in the high voltage region $p_H$ may include a high voltage peripheral gate electrode $230p_H$ and impurity layers $202p_H$. Similar to layers $202c$, impurity layers $202p_L$ and $202p_H$ may have different structures depending on their use in the low voltage transistor or the high voltage transistor. Also, the impurity layers $202p_L$ and $202p_H$ may have different doping concentration levels, different depths or widths and different impurity types depending on the needs of the associated transistor.

Cell spacers $250p_L$ and $250p_H$ may be similar to spacers $251c$ and may include a single or multi-layered structure of, for example, silicon oxide, silicon nitride and/or a low dielectric material. The cell spacers $250p_L$ and $250p_H$ may be formed on either side of the peripheral gate electrodes $230p_L$ and $230p_H$ and may extend from an upper location of the respective gates, for example, the top of the gates, to a location above the respective impurity layers $202p_L$ and $202p_H$. The interlayer dielectric 260 may be formed to generally cover the peripheral area of the nonvolatile device. Again, the interlayer dielectric 260 may include a single or multi-layered structure, for example, a silicon oxide layer, a silicon nitride layer, a polymer layer, and/or a low dielectric layer.

The low voltage gate electrode $230p_L$ may include a low voltage dielectric layer $232p_L$, a lower gate electrode layer $234p_L$ and an upper gate electrode layer $236p_L$. The low voltage gate electrode $230p_L$ may also include a hard mask layer 240. The high voltage gate electrode $230p_H$ may include a high voltage dielectric layer $232p_H$, a lower gate electrode layer $234p_H$ and an upper gate electrode layer $236p_H$. The high voltage gate electrode $230p_H$ may also include the hard mask layer 240. In both the low voltage gate and the high voltage gate, the dielectric layer 232 may be formed above the substrate, the lower gate electrode layer 234 may be formed above the dielectric layer 232, and the upper gate electrode layer 236 may be formed above the lower gate electrode layer 234.

As illustrated in FIG. 2, the low voltage gate electrode $230p_L$ and the high voltage gate electrode $230p_H$ may be formed above the substrate 100 and have similar structures and features. The low voltage gate electrode $230p_L$ may be formed for use at a lower voltage than the high voltage gate. Accordingly, the dielectric layer $232p_H$ of the high voltage gate electrode $230p_H$ may have a thickness greater than that of the dielectric layer $232p_L$ of the low voltage transistor. Similarly, the lower gate electrode layer $234p_H$ of the high voltage transistor may have a thickness greater than that of the lower gate electrode layer $234p_L$ of the low voltage transistor and the upper gate electrode layer $234p_H$ may have a thickness greater than that of upper gate electrode layer $234p_L$. The low voltage dielectric layer $232p_L$ and the high voltage dielectric layer $232p_H$ may include the same material as each other and may include one or more layers of, for example, silicon oxide, silicon nitride, silicon oxynitride, or a high-k dielectric, e.g., hafnium oxide or zirconium oxide.

In example embodiments, the lower gate electrode layer $234p_L$ of the low voltage gate electrode $230p_L$ and the lower gate electrode layer $234p_H$ of the high voltage gate electrode $230p_H$ may include a semiconductor material, for example poly-silicon. Furthermore, the lower gate electrodes layer $234p_L$ and $234p_H$, which include a semiconductor material, may be doped either N-type or P-type according to a desired work function of the transistor.

The upper gate electrode layer $236p_L$ of the low voltage gate electrode $230p_L$ and the upper gate electrode $236p_H$ of the high voltage gate electrode $230p_H$ may include a layer of, for example, a metal-silicide layer, e.g., tungsten silicide (WSi), titanium silicide (TiSi), tantalum silicide (TaSi), cobalt silicide (CoSi) and other known silicides.

According to example embodiments, forming the peripheral region "p" provides optimization or improvement of certain characteristics of the peripheral gate electrodes 230. For example, the use of a metal silicide as the upper gate electrode layer 236 in the peripheral region may reduce the resistance of the gate electrodes while providing a higher quality interface with the underlying lower gate electrode layer 234 formed of poly-silicon. The use of the metal silicide may further provide for forming the peripheral gate electrodes without the use of a barrier metal overlying the lower gate electrode of poly-silicon. Accordingly, the interface resistance of the peripheral gate electrodes may not be increased by use of the barrier layer. Generally, the upper gate electrode layer 236 may be formed to have a second resistance which, although optimized or improved for the peripheral region, has a higher value than the resistance of the low resistance layer 226 of the cell region. Also, the upper gate electrode layer 236 may be generally formed to have a thickness which may be greater than a thickness of the low resistance layer 236.

Referring now to FIGS. 3A-3I, a method of forming a non-volatile memory device according to example embodiments will be described. FIGS. 3A-3I are cross-sectional views taken along lines IIc-IIc', IIp$_L$-IIp$_L$' and IIp$_H$-IIp$_H$' of FIG. 1 and illustrate a sequence of processing operations that may be used to manufacture a non-volatile memory device.

Referring to FIG. 3A, a substrate 100 may be prepared having a cell region "c" and a peripheral region "p" wherein the peripheral region may include a low voltage peripheral region p$_L$ and a high voltage peripheral region p$_H$. Preparation of the substrate may include doping of the active areas 106c, 106p$_L$ and 106p$_H$ according to the characteristics of the transistors and other devices that will be formed therein. Preparation of the substrate may further include forming the isolation layer 102 so as to define locations of the active areas and to provide electrical isolation between them. In example embodiments, formation of the isolation layer 102 may include a shallow trench isolation process. Alternatively, the isolation layer 102 may be formed using a deep trench process or a field oxide isolation process.

Still referring to FIG. 3A, a gate dielectric layer 232 may be formed on the substrate 100. More specifically, the gate dielectric layer may be formed on the substrate 100 in both the cell region as $232p_L$ and the peripheral region including both the low and high voltage peripheral regions as $232p_L$ and $232p_H$, respectively. The gate dielectric layer 232 may be formed over the substrate using a variety of methods. For example, a first dielectric sub-layer may be formed over the substrate so as to have a thickness which may be relatively thin such as that which may be used for the low voltage gate electrode $230p_L$. The cell region "c" and the low voltage peripheral region p$_L$ may be masked and a second sub-layer of dielectric formed in only the high voltage peripheral region p$_H$. With the mask removed, a thicker dielectric layer may be formed in the high voltage peripheral region p$_H$ as compared to that formed in the cell region "c" and the low voltage peripheral region p$_L$. Alternatively, a first dielectric layer may be formed over the substrate having a thickness which may be relatively thick such as that which will be used for the high voltage gate electrode $230p_H$. A mask may be formed over cell region "c" and/or high voltage region p$_H$, the thick dielectric removed from the low voltage region p$_L$, a thinner dielectric formed in low voltage region p$_L$ and the mask removed so that the low and high voltage regions may be formed having dielectrics with appropriate thicknesses. FIG. 3A shows dielectric $232p_L$ formed in the low voltage peripheral region p$_L$ as well as the cell region "c" but this must be understood as merely an example.

A lower gate electrode layer 234 may be formed over the dielectric layer 232 and an upper gate electrode layer 236 may be formed over the lower gate electrode layer 234. The layers 234 and 236 may be formed in sequence over the substrate 100. The lower gate electrode layer 234 may be formed of a semiconductor material, for example, poly-silicon, which may be doped either in-situ or using ion implantation after it is deposited.

Figure 3B:
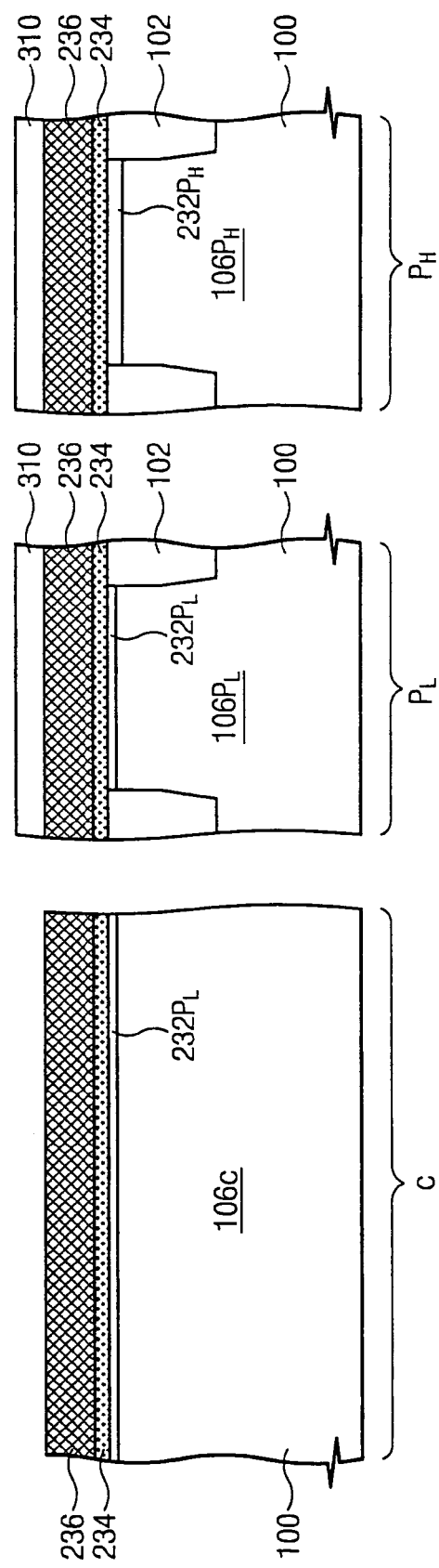

The upper gate electrode layer 236 may be formed on the lower gate electrode layer 234. The upper gate electrode layer 236 may be formed to have one or more layers and may be formed of, for example, a metal-silicide, e.g., tungsten silicide (WSi), titanium silicide (TiSi), tantalum silicide (TaSi), cobalt silicide (CoSi) and other known silicides. By using a metal silicide as the upper gate electrode layer 236, the upper gate electrode will have a lower resistivity than the lower gate electrode layer 234 formed of doped poly-silicon, and thus, the overall resistance of the peripheral gate may be lowered. Furthermore, the metal silicide may interface well with the underlying poly-silicon without substantial material diffusion. Accordingly, a barrier metal layer may not be necessary between the metal silicide layer and the underlying poly-silicon and therefore an interface resistance between the metal silicide layer and underlying poly-silicon layer may remain low. As further illustrated in FIG. 3A, a first mask pattern 310 may be formed overlying the upper gate electrode layer 236. The first mask pattern 310 may include one or more layers of, for example, oxide, nitride, oxynitride, and/or doped glass. As illustrated in FIG. 3B, the first mask pattern 310 may be removed from the cell region "c", leaving peripheral regions p$_L$ and p$_H$ covered.

As illustrated in FIG. 3C, the upper gate electrode layer 236, the lower gate electrode layer 234 and the dielectric layer $232p_L$ may be removed from cell region "c". These layers may be removed by known processes, e.g., wet etching. The upper gate electrode layer 236, the lower gate electrode layer 234 and the dielectric layer 232 may not be removed from the peripheral regions p$_L$ and p$_H$ because they remain covered by first mask pattern 310. After the removal, active areas 106c in the cell area of substrate 100 may be exposed.

As illustrated in FIG. 3D, a layered insulating structure 210 and a layered conducting structure 220 may be formed overlying the substrate 100 in both the cell region and the peripheral region. As illustrated, the layered insulating structure 210 and the layered conducting structure 220 may be formed in sequence on the exposed active areas 106c in the cell region and may be formed on the first mask pattern 310 in the peripheral regions $p_L$ and $p_H$. The layered insulating structure 210 may include a tunnel insulating layer 212, a charge storage insulating layer 214 and a blocking insulating layer 216. The tunnel insulating layer 212 may be formed above the substrate 100 in cell region "c" and may include one or more layers of, for example, silicon oxide, silicon oxynitride (SiON), silicon nitride, a silicon oxide layer having a nitrided portion, aluminum oxide ($Al_2O_3$), hafnium aluminate (HfAlO), hafnium aluminum oxynitride (HfAlON), hafnium silicate (HfSiO) and hafnium silicon oxynitride (HfSiON). The tunnel insulating layer 212 may be formed by known methods.

The charge storage insulating layer 214 may be formed above the tunnel insulating layer 212 and may be used to trap or store charges for use in programming each cell gate WL. The charge storage insulating layer 214 may include one or more layers of, for example, poly-silicon, silicon nitride, silicon oxynitride, silicon rich oxide, ferroelectric materials, nano-crystalline silicon, nano-crystalline silicon germanium, nano-crystalline metal, aluminum oxide ($Al_2O_3$), hafnium oxide ($HfO_2$), hafnium aluminate (HfAlO), hafnium aluminum oxynitride (HfAlON), hafnium silicate (HfSiO) and/or hafnium silicon oxynitride (HfSiON). The charge storage insulating layer 214 may include a quantum-dot layer. For example, the charge storage insulating layer 214 may include a layer of silicon, germanium, and/or metal quantum-dots.

The blocking insulating layer 216 may be formed above the charge storage insulating layer 214 and may be chosen to have a dielectric constant greater than that of the tunnel insulating layer 212. The blocking insulating layer 216 and may include a metallic oxide or a metallic oxynitride of a Group III element or a Group VB element. According to other example embodiments, the blocking insulating layer 216 may include a doped metal oxide or a doped metal oxynitride in which the metal oxide may be doped with a Group IV element. The Group IV element may reduce leakage current from the memory cell. The Group IV element may be doped in the metal oxide to about 0.1 to 30 weight percent. The blocking insulating layer 216 may include one or more layers of, for example, silicon oxide, silicon oxynitride (SiON), silicon nitride, and metallic oxide, e.g., aluminum oxide ($Al_2O_3$), hafnium oxide ($HfO_2$), hafnium aluminate ($Hf_{1-x}Al_xO_y$), hafnium aluminum oxynitride (HfAlON), hafnium silicate ($Hf_xSi_{1-x}O2$), hafnium silicon oxynitride (HfSiON), lanthanum oxide ($La_2O_3$), zirconium oxide ($ZrO_2$), zirconium silicon oxide ($Zr_xSi_{1-x}O_2$), and/or zirconium silicon oxynitride (ZrSiON). The material $Al_2O_3$ may have a dielectric constant of about 10 and an energy band gap of about 8.3 eV and the material $ZrO_2$ has a dielectric constant of about 25 and an energy band gap of about 8.3 eV. The blocking insulating layer 216 may also include one or more layers of Al, $Ta_2O_5$, $TiO_2$, PZT[(Pb(Zr, Ti)$O_3$)), $PbTiO_3$, $PbZrO_3$, PLZT[(Pb,La)(Zr, $TiO_3$)], PbO, $SrTiO_3$, $BaTiO_3$, $V_2O_5$, BST[(Ba,Sr)$TiO_3$], SBT($SrBi_2Ta_2O_9$), $Bi_4Ti_3O_{12}$, and combinations thereof.

In example embodiments, the blocking insulating layer 216 may include a layer similar to that of the charge storage insulating layer 214. For example, both the blocking insulating layer 216 and the charge storage insulating layer 214 may include a layer of hafnium aluminate (HfAlO), hafnium aluminum oxynitride (HfAlON), hafnium silicate (HfSiO) and/or hafnium silicon oxynitride (HfSiON). In such a case, a relative stoichiometric amount of hafnium in the charge storage insulating layer 214 may be made higher than the relative stoichiometric amount of hafnium in the blocking insulating layer 216 so as to increase a trap density in the charge storage insulating layer 214 and to enhance an insulation characteristic of the blocking insulating layer 216.

In example embodiments, the blocking insulating layer 216 may have a dielectric constant higher than that of the tunnel insulating layer 212. For example, the blocking insulating layer 216 may include at least one layer of material having a dielectric constant that may be higher than any layer included in the tunnel insulating layer 212. In example embodiments, the blocking insulating layer 216 and the tunnel insulating layer 212 may be formed of materials having substantially similar dielectric constants, for example, they may be formed of the same material. In that case, the blocking insulating layer 216 may have a thickness that may be greater than a thickness of the tunnel insulating layer 212.

As further illustrated in FIG. 3D, a layered conducting structure 220 may be formed on the layered insulating structure 210. The layered conducting structure 220 may include an energy barrier layer 222, a barrier metal layer 224 and a low resistance layer 226. The energy barrier layer 222 may be formed above the blocking insulating layer 216 and may include a metal having a work function greater than about 4 eV. For example, the energy barrier layer 222 may include one or more layers of, for example, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide ($Ti_3Al$), titanium aluminum nitride ($Ti_2AlN$), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium (Ru), ruthenium dioxide ($RuO_2$) nickel silicide (NiSi), palladium (Pd), iridium (Ir), platinum (Pt), cobalt (Co), cobalt silicide (CoSi) and/or aluminum silicide (AlSi). By using an energy barrier layer 222 having a work function greater than about 4 eV, charges from the overlying low resistance layer 226 may be prevented or retarded from moving to the charge storage insulating layer 214 during an erase function of the memory cell.

The barrier metal layer 224 may be formed above the energy barrier layer 222. The barrier metal layer 224 may be formed of a material that reduces or prevents an interfacial reaction and/or diffusion between the blocking insulating layer 216 or energy barrier layer 222 and the overlying low resistance layer 226. The barrier metal layer 224 may include one or more layers of, for example, tungsten nitride (WN), tungsten silicon nitride (WSiN) titanium nitride (TiN) or any other metal nitride that aides in preventing or reducing an interfacial reaction and/or mutual diffusion.

The low resistance layer 226 may be formed above the barrier metal layer 224. The low resistance layer may include one or more layers of, for example, tungsten (W), copper (Cu), aluminum (Al), gold (Au), silver (Ag), molybdenum (Mo), titanium (Ti), platinum (Pt), palladium (Pd) and other low resistance materials. The low resistance layer 226 in the cell region may be formed of a material having a lower resistivity than the upper electrode layer 236 of the peripheral region. Also, the low resistance layer 226 in the cell region may have a thickness which may be less than a thickness of the upper electrode layer 236. Generally, the low resistance layer 226 may be formed of a material different from that of the upper electrode layer 236.

Also illustrated in FIG. 3D, a second mask pattern 320 may be formed to overly the conducting structure 220. Ultimately, the second mask pattern 320 may overlay only the conducting structure 220 in the cell region "c". To achieve this end, the second mask pattern 320 may be selectively deposited only in the cell region "c" or may be blanket deposited over both the cell region "c" and the peripheral region "p" and then selectively removed in the peripheral region "p". Either way, as illustrated in FIG. 3D, the second mask pattern 320 may be formed such that the conducting structure 220 in the peripheral region may be exposed. Similar to the first mask pattern 310, the second mask pattern 320 may include one or more layers of, for example, oxide, nitride, oxynitride, and/or doped glass. The second mask pattern 320 may be formed of the same material or a different material from that of first mask pattern 310.

As illustrated in FIG. 3E, the conducting structure 220 and the insulating structure 210 may be removed from the peripheral region "p". By using the second mask pattern 320, the conducting structure 220 and the insulating structure 210 may be selectively removed from the peripheral region "p" while remaining in the cell region "c". The selective removal may be performed until the first mask pattern 310 in the peripheral region is exposed. The first mask pattern 310 in the peripheral region may perform as an etch stop.

Figure 3G:
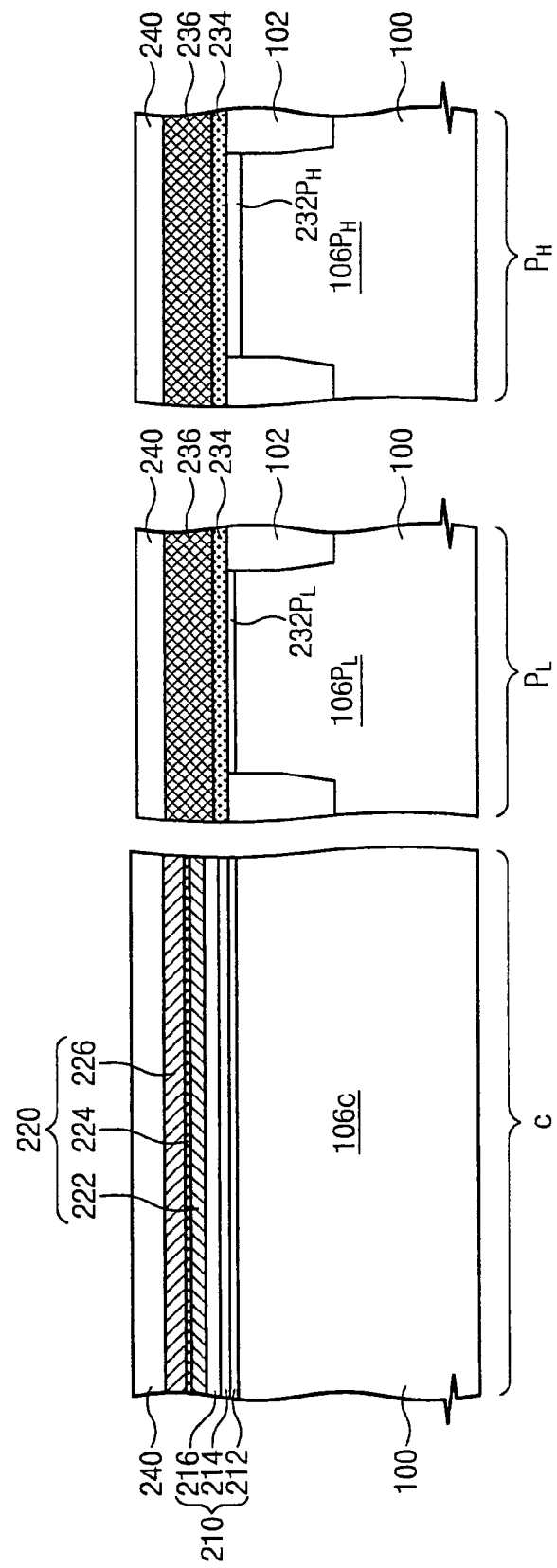

As illustrated in FIG. 3F, the first mask pattern 310 may be removed from the peripheral region while the second mask pattern 320 may be removed from the cell region. Both mask layers may be completely removed by known wet-etching or dry-etching methods. With the mask layers removed, the upper gate electrode layer 236 may be exposed in the peripheral region while the low resistance layer 226 may be exposed in the cell region. As illustrated in FIG. 3G, a hard mask layer 240 may be formed over the upper gate electrode layer 236 in the peripheral region and the low resistance layer 226 in the cell region. The hard mask layer 240 may be formed of, for example, oxide, nitride, and/or oxynitride.

Figure 3H:
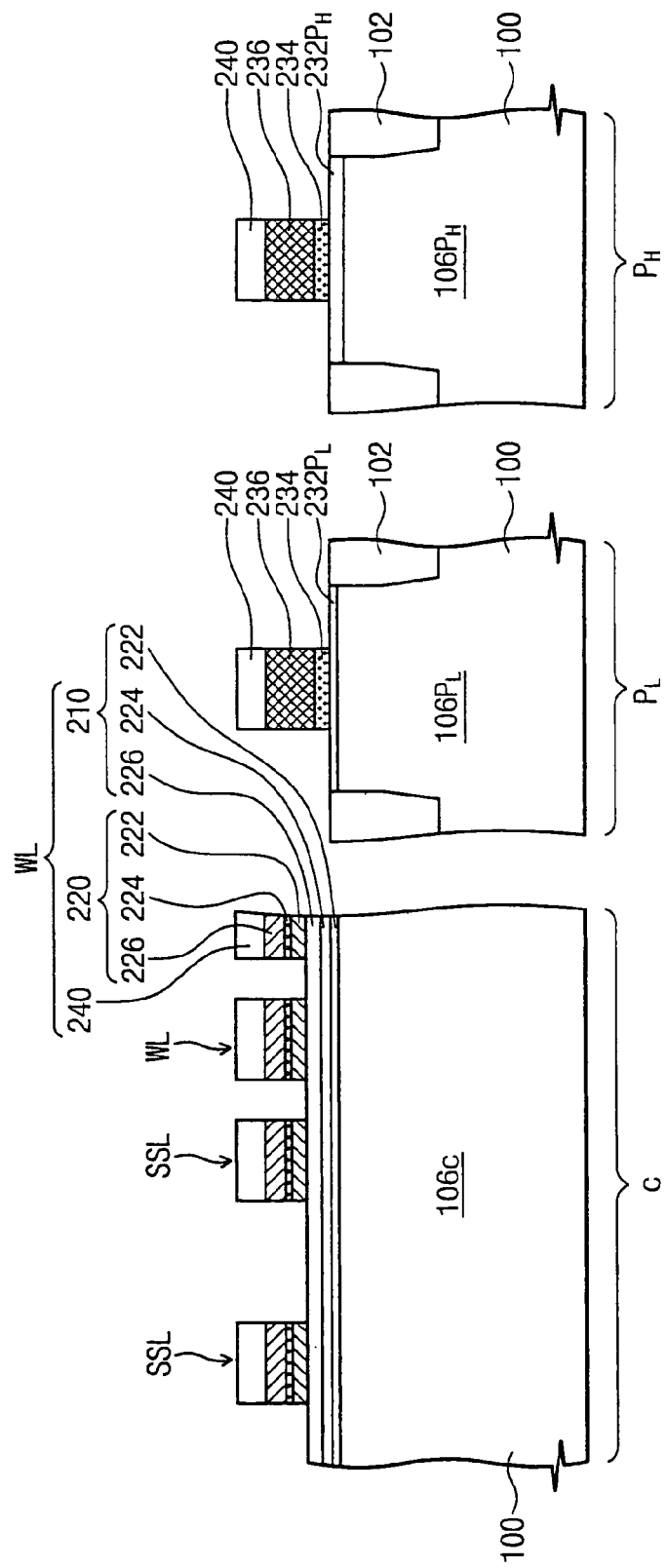

As illustrated in FIG. 3H, the hard mask layer 240 and conducting structure 220 may be patterned in the cell region "c" to form the SSL and WLs as shown, as well as the GSL, which is not shown. In example embodiments, the patterning of the hard mask layer 240 and the conducting structure 220 may be performed by etching, using the blocking insulating layer 216 as an etch stop. Accordingly, the SSLs, WLs and GSLs may be formed having an insulating structure 210 that includes a tunnel insulating layer 212, charge storage insulating layer 214 and blocking insulating layer 216 and having a conducting structure 220 including an energy barrier 222, a barrier metal layer 224 and a low resistance layer 226. Because the blocking insulating layer 216 is used as an etch stop, the insulating structure 210 may be formed underlying and extending between the SSLs and WLs as shown and the GSL though not shown.

As further illustrated in FIG. 3H, the hard mask layer 240, the upper gate electrode layer 236, and the lower gate electrode layer 234 may be patterned in the peripheral region "p" to form the low voltage gate electrode $230p_L$ and the high voltage gate electrode $230p_H$. The dielectric layer 232 may be used as an etch stop in the peripheral region. Each of the low voltage gate electrode $230p_L$ and the high voltage gate electrode $230p_H$ include a dielectric layer $232p_L$ or $232p_H$, lower gate electrode layer 234, upper gate electrode layer 236 and hard mask layer 240. In example embodiments, the etching of the cell region may be performed simultaneously with the etching of the peripheral region so that the SSLs, WLs, and GSLs may be formed at the same time as the low voltage gate electrode $230p_L$ and high voltage gate electrode $230p_H$, wherein the blocking insulating layer 216 may be used as an etch stop in the cell region "c" and the dielectric layer 232 may be used as an etch stop in the peripheral region "p".

Figure 3I:
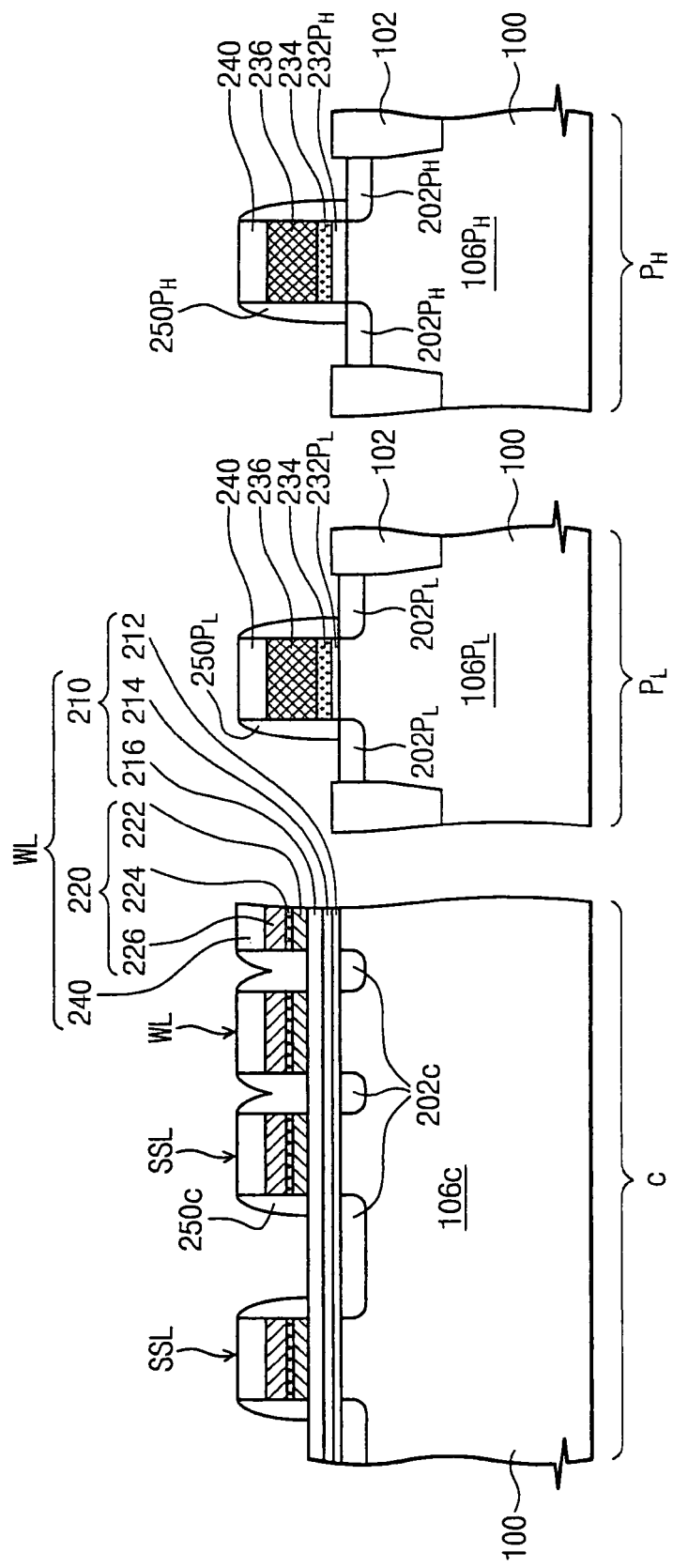

As illustrated in FIG. 3I, impurity layers 202c, $202p_L$ and $202p_H$ may be formed on either sides of the gates SSL, WL, GSL in the cell region as well as the gate electrodes $230p_L$ and $230p_H$ in the peripheral region. The impurity layers 202 may be formed as source and drain regions as well as contact regions as necessary. The impurity regions may be formed using a well known ion implantation process and may be formed simultaneously or at different times depending on the requirements of each impurity region. For example, if certain impurity regions require different types of impurities, different concentrations, different implantation angles or other differing variables, the impurity layers 202 may be formed at different times.

As further illustrated in FIG. 3I, spacers 250c, $250p_L$ and $250p_H$ may be formed on the sidewalls of the conductive structures SSL, WL and GSL in the cell region as well as the low voltage gate electrode $230p_L$ and the high voltage gate electrode $230p_H$ in the peripheral region. The spacers 250 may be formed using a conformal deposition of, for example, oxide, followed by an etch process. The spacers may include one or more layers of, for example, silicon oxide, silicon nitride and/or a low dielectric material. Following the formation of spacers 250, additional implantation may be performed in the source/drain regions, for example, to form lightly doped drain (LDD) regions, as necessary.

Following the process illustrated in FIG. 3I, an interlayer dielectric 260 (illustrated in FIG. 2) may be formed overlying the structure formed heretofore. The interlayer dielectric may include one or more layers of, for example, silicon oxide, silicon nitride, a polymer layer, and/or a low dielectric layer. The bitline contact DC and the CSL may be formed in the interlayer dielectric 260 so as to make contact with their respective impurity layers 202. Finally, the bit line 104 may be formed overlying the interlayer dielectric 260 so as to make contact with the bitline contact DC so that the formation of the non-volatile device may be substantially finished.

As illustrated in FIGS. 3A-3E and as discussed above, in example embodiments, the dielectric layer 232, the lower gate electrode layer 234, the upper gate electrode layer 236 and first mask pattern 310 may be first formed over the exposed substrate 100 followed by removal of the same layers in the cell region to expose the substrate 100 in the cell region while leaving the layers remaining in the peripheral region. After removal of the layers 232, 234, 236 and 310 from the cell region, the insulating structure 210, conducting structure 220 and second mask pattern 320 may be formed over the exposed substrate 100 in the cell region and over the first mask pattern 310 in the peripheral region. Subsequently, the insulating structure, conducting structure and second mask pattern 320 may be removed from the peripheral region to thus form the structure illustrated in FIG. 3E.

In example embodiments, the formation order may be substantially reversed. For example, the insulating structure 210, the conducting structure 220 and second mask pattern 320 may first be formed overlying the exposed substrate 100 followed by selective removal of these layers from the peripheral region only. The dielectric layer 232, the lower gate electrode layer 234, upper gate electrode layer 236 and the first mask pattern 310 may be formed overlying the exposed substrate 100 in the peripheral region as well as overlying the second mask pattern 320 in the cell region. In that case, selective etching of the first mask pattern 310, upper electrode layer 236, lower electrode layer 234 and dielectric layer 232 may be performed for their removal in the cell region using the second mask pattern 320 as an etch stop. Accordingly, the structure of FIG. 3E may be achieved by an alternative method and processing as to the method of FIGS. 3F-3I.

Figure 4:
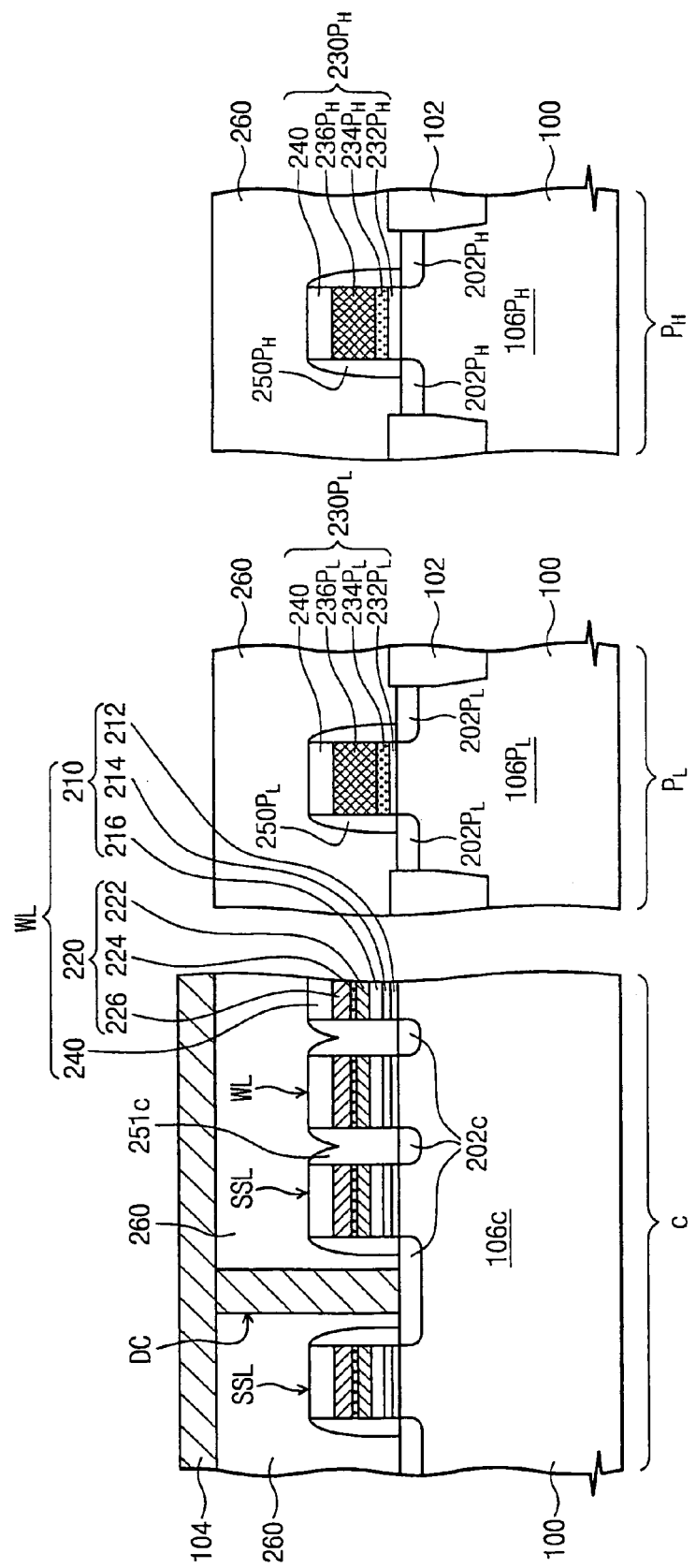

FIG. 4 illustrates other example embodiments. FIG. 4 is a cross-sectional view taken along lines IIc-IIc', IIp$_L$-IIp$_L$' and IIp$_H$-IIp$_H$' of FIG. 1. Example embodiments as illustrated in FIG. 4 are substantially similar to that illustrated in FIG. 2. For example, as illustrated in both FIG. 2 and FIG. 4, an insulating structure 210 and a conducting structure 220 may be formed in the cell region and a dielectric layer 232, a lower gate electrode layer 234 and an upper gate electrode layer 236 may be formed in the peripheral region. However, as illustrated in FIG. 4, the cell spacers 251c may be formed to extend from an upper location of the conducting structure 220, for example, the top of the conductive structure, to the surface of substrate 100. Accordingly, as illustrated in FIG. 4, the sidewall spacers 251c may be formed along an entire side of the SSLs, WLs and GSLs (not shown). For example, the spacers 251c may be formed on a side of the tunnel insulating layer 212, charge storage insulating layer 214 and blocking insulating layer 216 of the insulating structure 210 as well as the energy barrier layer 222, barrier metal layer 224 and low resistance layer 226 of the conducting structure 220.

Figure 5A:
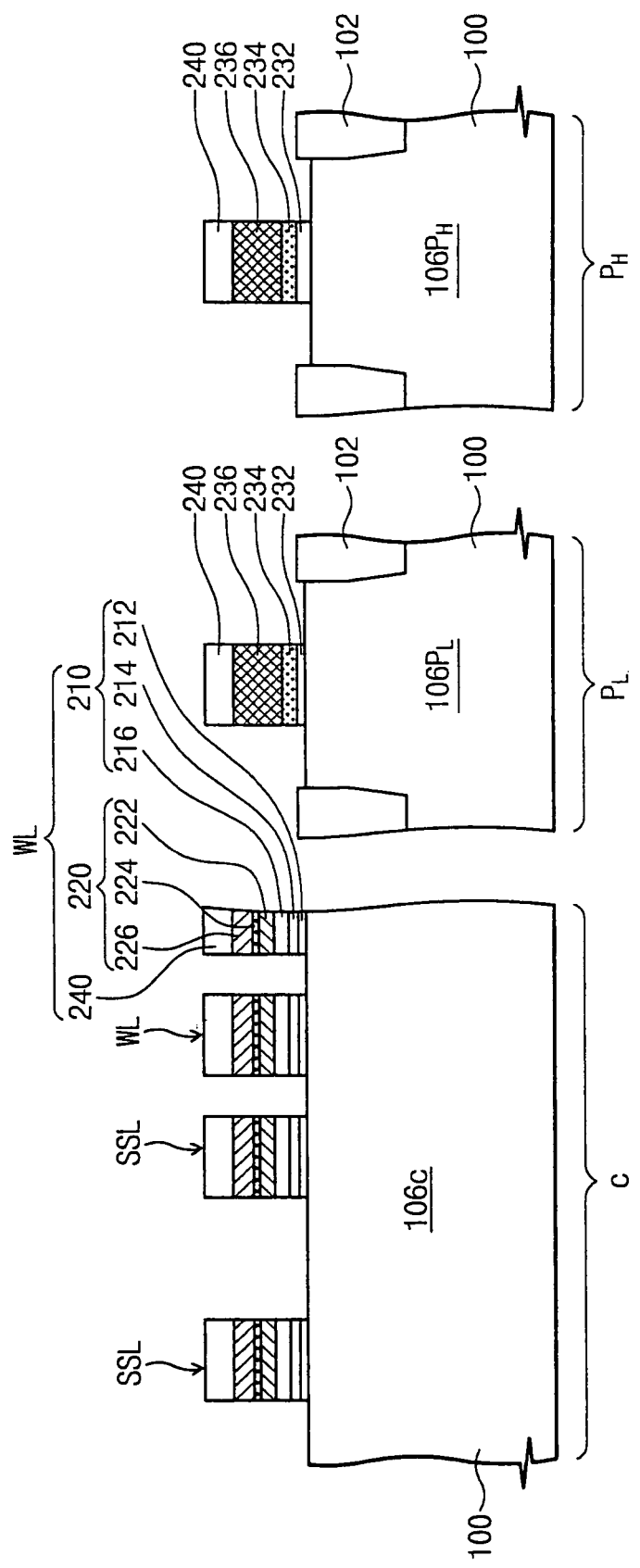
FIGS. 5A-5B are cross-sectional views illustrating a method of forming a nonvolatile memory device according to example embodiments.
Figure 5B:
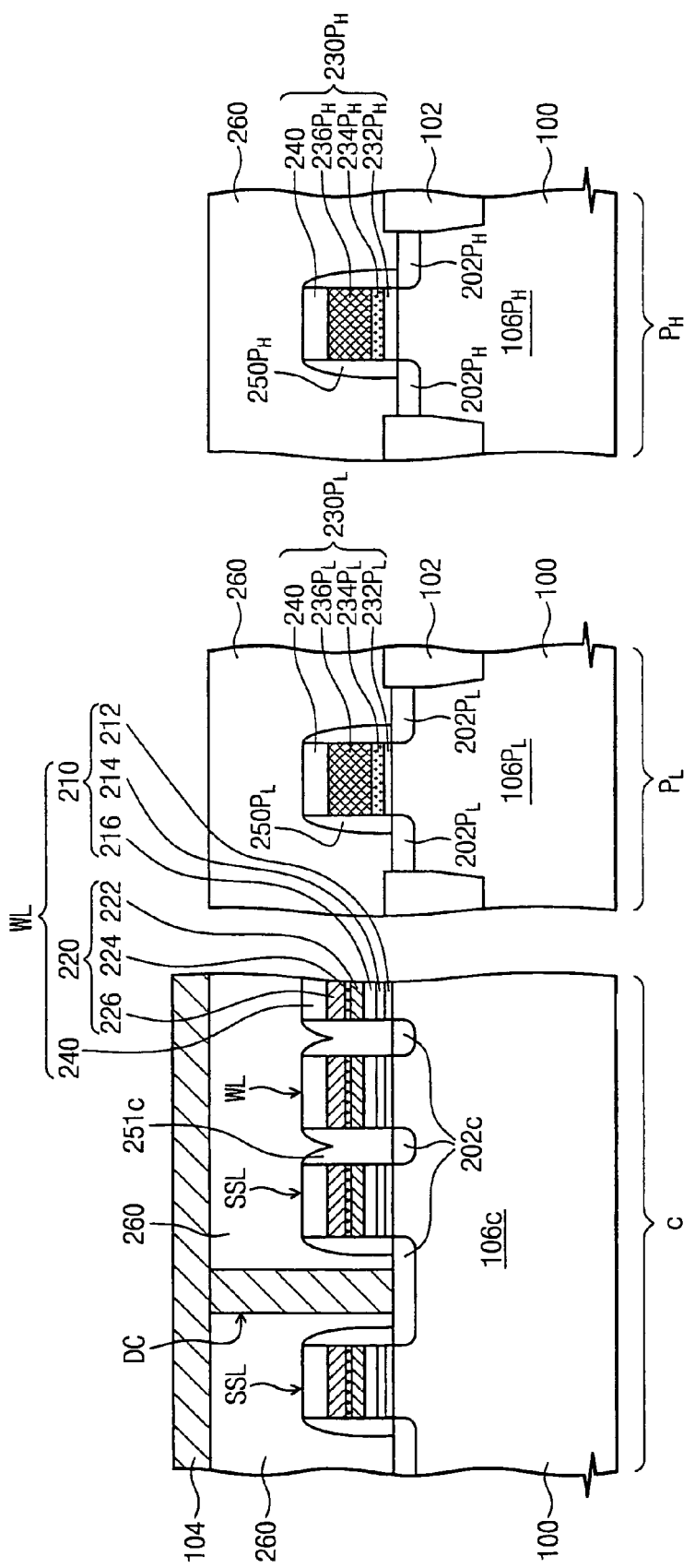

FIGS. 5A and 5B illustrate a method of fabricating the device of FIG. 4. The process of FIGS. 5A and 5B may include operations included in FIGS. 3A-3I which will be referred to accordingly. As an example, a process of forming the device of FIG. 4 may include the processing operations of FIGS. 3A-3G. For example, prior to the processing illustrated in FIG. 5A, the processes of FIGS. 3A-3G have been completed. Moreover, the process of FIG. 5A is similar to that illustrated in FIG. 3H. More specifically, FIG. 5A illustrates the formation of the SSLs, WLs and GSLs (not shown) in the cell region as well as the low voltage gate electrode 230p$_L$ and the high voltage gate electrode 230p$_H$ in the peripheral region. Example embodiments may include a two-operation etching process regarding the formation of the gate lines in the cell region. As illustrated in FIG. 3H, a first etching operation may be used to form individual conducting structures 220 of the SSLs and WLs while the underlying layered insulating structure 210 remain common. In a second operation, the layered insulating structure 210 may be etched to form insulating layers (e.g. tunnel insulating layer 212, charge storage insulating layer 214 and blocking insulating layer 216) for each of the SSLs and WLs. For example, after the first etching operation has been completed, a mask layer may be formed overlying the peripheral region in which the low and high voltage gate electrodes have already been formed. After formation of the overlying mask in the peripheral region, a second etch operation may proceed in the cell region. Therefore, the layered insulating structure 210 will be etched to form the individual SSLs, WLs and GSLs as illustrated in FIG. 5A.

FIG. 5B illustrates a process similar to that of FIG. 3I wherein cell spacers 250p$_L$, 250p$_H$ and 251c may be formed in the peripheral regions and cell region. For example, a dielectric layer may be deposited over the substrate and appropriately etched so as to form the spacers. The processing to form the spacers 250p$_L$, 250p$_H$ and 251c may be substantially similar to that discussed regarding FIG. 3I. Also, FIG. 5B may include the interlayer dielectric 260, bit line contact DC, and bit line 104.

Figure 6:
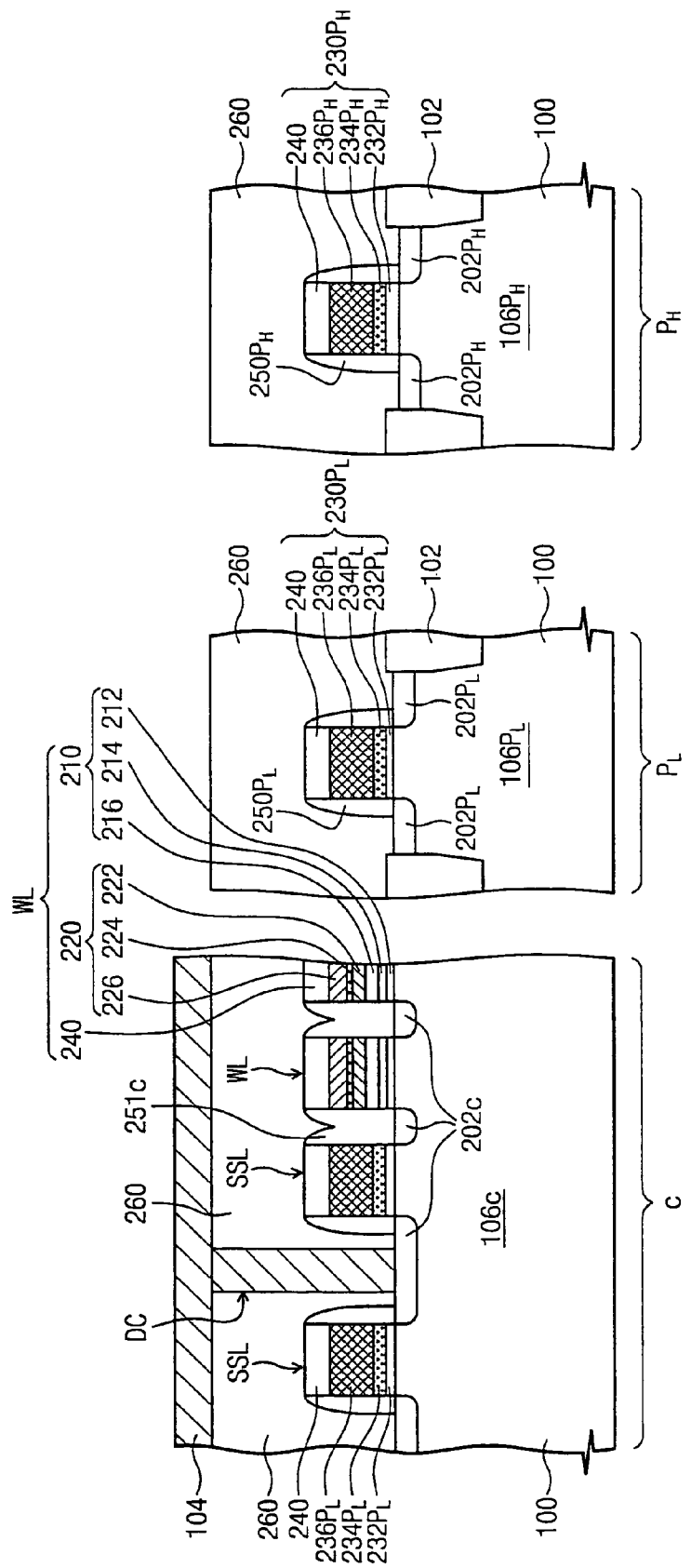

FIG. 6 illustrates another nonvolatile memory device according to example embodiments. FIG. 6 is a cross-sectional view taken along lines IIc-IIc', IIp$_L$-IIp$_L$' and of FIG. 1. As shown in FIG. 6, the SSL gates in the cell region "c", as well as the GSL gates not shown, may have a structure substantially similar to that of the low voltage gate electrode 230p$_L$ of the peripheral region p$_L$. For example, the SSL and GSL gates may include a dielectric layer 232p$_L$, a lower electrode layer 234p$_L$ and an upper electrode layer 236p$_L$ as does the low voltage gate electrode 230p$_L$ formed in the peripheral region p$_L$. The SSL and GSL gates may further include a hard mask layer 240. Forming of the SSL and GSL gates similar to that of the low voltage gate electrode 230p$_L$ allows greater choice in the design of the nonvolatile memory device.

Figure 7A:
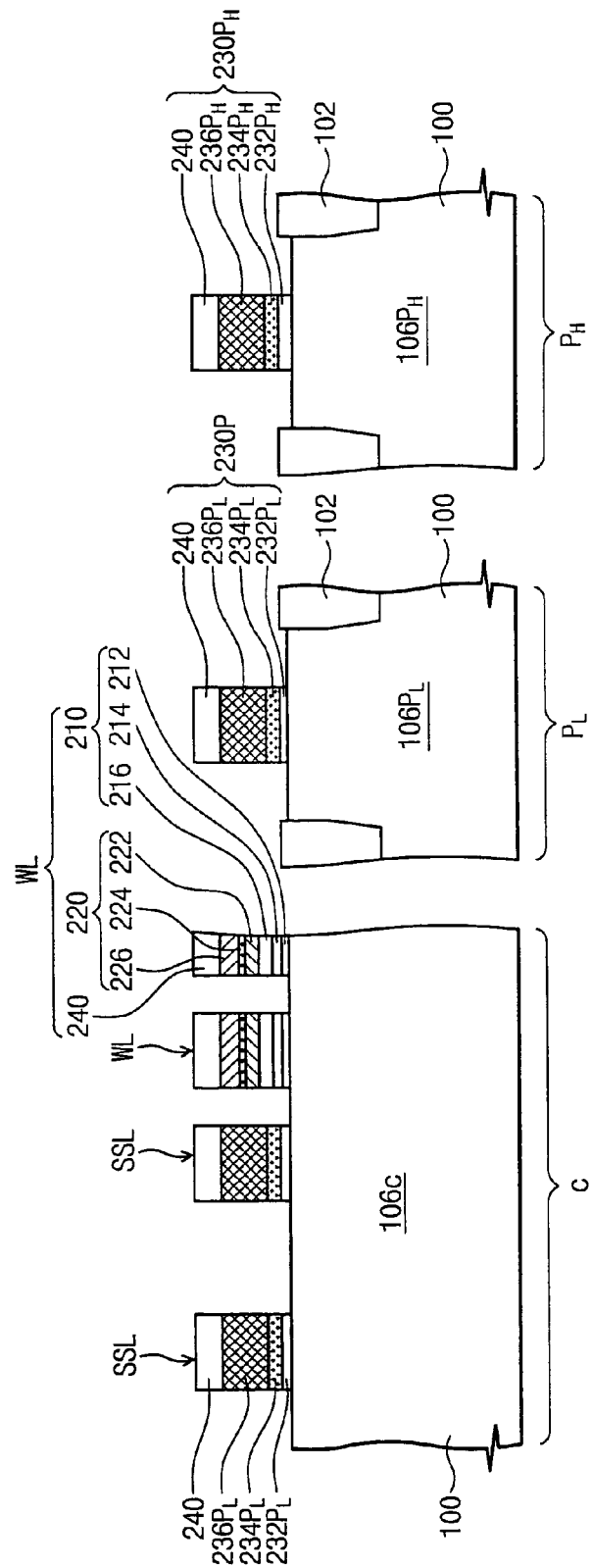
Figure 7B:
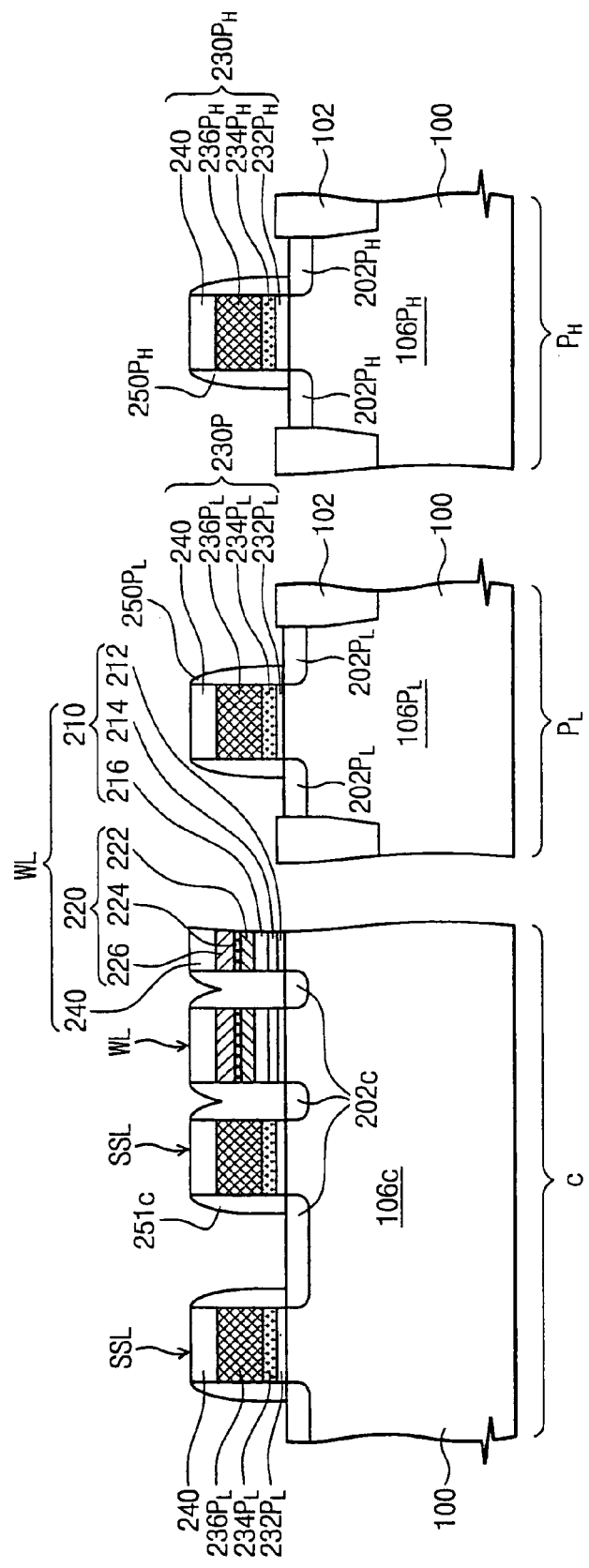

FIGS. 7A and 7B illustrate a process of manufacturing the device of FIG. 6 according to example embodiments. The processes of FIGS. 7A and 7B may include operations included in FIGS. 3A-3I which will be referred to accordingly. For example, fabrication of the device of FIG. 6 may include the process illustrated in FIG. 3A and a process similar to that illustrated in FIG. 3B. However, in the process of FIG. 3B, a modification may be made such that first mask pattern 310 remains over the peripheral region as well as over the SSL and GSL sub-regions within the cell region. For example, a location in the cell region in which the SSL and GSL will be later patterned may remain covered with first mask pattern 310. Using the first mask pattern 310, the dielectric layer 232, lower gate electrode layer 234 and upper gate electrode layer 236 may be removed only selectively from cell region "c" to expose the substrate 100 in areas where cell gates WL may be formed. Subsequently, the insulating structure 210 and conducting structure 220 may be formed overlying the exposed substrate 100 in the cell region. In example embodiments and similar to example embodiments illustrated and explained with reference to FIGS. 3A-3E, the formations in the cell region and the peripheral regions may be alternated. For example, the insulating structure 210 and the conducting structure 220 may first be formed over the substrate 100. The insulating structure 210 and the conducting structure 220 may then be selectively masked in the cell region, specifically in the cell region where cell gates WL may be formed and selectively etched leaving the insulating structure 210 and the conducting structure 220 only in the cell gate area. Thereafter, the dielectric layer 232, lower gate electrode layer 234 and upper gate electrode layer 236 may be formed overlying the substrate including the conducting structure 220. Of course, the formation of these layers may include first and second mask patterns 310 and 320 as appropriate.

FIG. 7A illustrates a processing operation which follows the deposition and selective etching of the insulating structure 210 and conducting structure 220 in cell region "c". FIG. 7A is similar in processing to that illustrated in FIG. 3H and FIG. 5A. More specifically, FIG. 7A illustrates the formation of the SSLs, WLs and GSLs (not shown) in the cell region as well as the low voltage gate electrode 230P$_L$ and the high voltage gate electrode 230p$_H$ in the peripheral region. The process may include a two-operation etching process regarding the formation of the cell gates WL in the cell region. That is, as illustrated in FIG. 3H, a first etching operation may be used to form individual conducting structures 220 of the WLs while the underlying insulating structure 210 remains common. In a second operation, the layered insulating structure may be etched to form insulating layers (e.g. tunnel insulating layer 212, charge storage insulating layer 214 and blocking insulating layer 216) for each of the WLs. For example, after the first etching operation has been completed, a mask layer may be formed overlying the peripheral region in which the low and high voltage gate electrodes have already been formed as well as the area of the cell region in which the SSLs and GSLs may be formed. After formation of the overlying mask, the second etch operation may proceed in the cell region. Therefore, the layered insulating structure 210 may be etched to form the individual WLs as illustrated in FIG. 7A while the SSLs and GSLs have been etched and formed coincident with the formation of the low voltage gate electrode $230p_L$ and the high voltage gate electrode $230p_H$.

FIG. 7B illustrates a process similar to that of FIG. 3I and FIG. 5B wherein cell spacers $250p_L$, $250p_H$ and $251c$ may be formed in the peripheral regions and cell region. That is, a dielectric layer may be deposited over the substrate and appropriately etched so as to form the spacers. The processing to form the spacers $250p_L$, $250p_H$ and $251c$ may be substantially similar to that discussed regarding FIG. 3I and FIG. 5B. Following the formation of the cell spacers, the interlayer dielectric 260 and remaining metallization may be formed.

Although example embodiments have been shown in FIG. 6, wherein the SSL and GSL may be formed similar to the low voltage gate electrode $230p_L$, the SSL and GSL may also be formed similar to that of the high voltage gate electrode $230p_H$.

While example embodiments have been shown and described with reference to certain example embodiments thereof, it will be understood by those skilled in the art that various changes in form and details may be made therein without departing from the spirit and scope of the appended claims and their equivalents.

What is claimed is:

1. A nonvolatile memory device, comprising:
   a plurality of memory cell transistors for storing data, each of the plurality of the memory cell transistors including a cell semiconductor layer, a cell gate electrode and a charge storage layer between the cell semiconductor layer and the cell gate electrode; and
   a plurality of peripheral transistors for driving the memory cell transistors, each of the plurality of the peripheral transistors including a peripheral semiconductor layer, a peripheral gate electrode and a gate insulating layer between the peripheral semiconductor layer and the peripheral gate electrode,
   wherein resistivity of the cell gate electrode is less than that of the peripheral gate electrode.

2. The nonvolatile memory device of claim 1, wherein the peripheral gate electrode comprises a plurality of conductive layers, and
   wherein the resistivity of the peripheral gate electrode is less than that of a conductive layer having the lowest resistivity among the plurality of conductive layers constituting the peripheral gate electrode.

3. The nonvolatile memory device of claim 1, wherein the peripheral gate electrode comprises a lower conductive layer and an upper conductive layer, and resistivity of the upper conductive layer is less than that of the lower conductive layer.

4. The nonvolatile memory device of claim 3, wherein the resistivity of the cell gate electrode is less than that of the upper conductive layer.

5. The nonvolatile memory device of claim 3, wherein the cell gate electrode is thicker than the upper conductive layer.

6. The nonvolatile memory device of claim 3, wherein the lower conductive layer includes poly-silicon and the peripheral gate electrode includes a metal-silicide.

7. The nonvolatile memory device of claim 1, wherein the cell gate electrode includes at least one of W, Cu, Al, Au, Ag, Mo, Ti, Pt and Pd.

8. The nonvolatile memory device of claim 1, wherein the cell gate electrode further comprises an energy barrier layer between the blocking insulating layer and the cell gate electrode; and a barrier metal layer between the energy barrier layer and the cell gate electrode.

9. The nonvolatile memory device of claim 8, wherein the energy barrier layer includes a material having a work function greater than about 4 eV.

10. The nonvolatile memory device of claim 8, wherein the barrier metal layer includes at least one of WN, WSiN and TiN.

11. The nonvolatile memory device of claim 8, wherein the energy barrier layer includes at least one of a p-doped semiconductor, Ta, TaN, TaTi, TaPt, TaSiN, Ti, TiN, $Ti_3Al$, $Ti_2AlN$, W, WN, WSi, Hf, HfN, Nb, Mo, $Mo_2N$, Ru, $RuO_2$, NiSi, Pd, Ir, Pt, Co, CoSi and AlSi.

12. The nonvolatile memory device of claim 1, wherein the plurality of memory cell transistors further comprises a tunnel insulating layer between the cell semiconductor layer and the charge storage layer and a blocking insulating layer between the cell gate electrode and the charge storage layer.

13. The nonvolatile memory device of claim 1, wherein the charge storage layer includes one or more layers of poly-silicon, silicon nitride, silicon oxynitride, silicon rich oxide, ferroelectric materials, nano-crystalline silicon, nano-crystalline silicon germanium, nano-crystalline metal and metallic oxide.

14. The nonvolatile memory device of claim 1, wherein the plurality of memory cell transistors are connected in series to form a cell string.

15. The nonvolatile memory device of claim 14, wherein the cell string comprises a string select transistor and a ground select transistor, and
   wherein the plurality of memory cells are connected between the string and the ground select transistors.

16. The nonvolatile memory device of claim 15, further comprising:
   a bit line crossing over the cell string and being electrically connected to the cell string.

* * * * *